(12) United States Patent
Okamoto et al.

(10) Patent No.: US 11,367,739 B2
(45) Date of Patent: Jun. 21, 2022

(54) SEMICONDUCTOR DEVICE AND ELECTRONIC COMPONENT

(71) Applicant: SEMICONDUCTOR ENERGY LABORATORY CO., LTD., Atsugi (JP)

(72) Inventors: Yuki Okamoto, Kanagawa (JP); Yoshiyuki Kurokawa, Kanagawa (JP); Naoto Kusumoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 365 days.

(21) Appl. No.: 16/625,823

(22) PCT Filed: Jun. 15, 2018

(86) PCT No.: PCT/IB2018/054405
§ 371 (c)(1),
(2) Date: Dec. 23, 2019

(87) PCT Pub. No.: WO2019/003037
PCT Pub. Date: Jan. 3, 2019

(65) Prior Publication Data
US 2021/0159252 A1    May 27, 2021

(30) Foreign Application Priority Data
Jun. 27, 2017 (JP) .............................. JP2017-125124

(51) Int. Cl.
*H01L 27/12* (2006.01)
*H01L 29/24* (2006.01)
(Continued)

(52) U.S. Cl.
CPC ...... *H01L 27/1225* (2013.01); *H01L 27/1207* (2013.01); *H01L 27/1255* (2013.01);
(Continued)

(58) Field of Classification Search
CPC ............. H01L 27/1225; H01L 27/1207; H01L 27/1255; H01L 29/24; H01L 29/78648;
(Continued)

(56) References Cited

U.S. PATENT DOCUMENTS

2011/0133182 A1    6/2011   Saito et al.
2011/0148835 A1    6/2011   Yamazaki
(Continued)

FOREIGN PATENT DOCUMENTS

JP    2003-214823 A    7/2003
JP    2008-245153 A    10/2008
(Continued)

OTHER PUBLICATIONS

International Search Report (Application No. PCT/IB2018/054405) dated Oct. 2, 2018.
(Continued)

*Primary Examiner* — Tomi Skibinski
(74) *Attorney, Agent, or Firm* — Fish & Richardson P.C.

(57) ABSTRACT

A semiconductor device capable of retaining a signal sensed by a sensor element is provided. The semiconductor device includes a sensor element, a first transistor, a second transistor, and a third transistor. One electrode of the sensor element is electrically connected to a first gate. The first gate is electrically connected to one of a source and a drain of the third transistor. One of a source and a drain of the first transistor is electrically connected to a gate of the second transistor. A semiconductor layer includes a metal oxide.

21 Claims, 21 Drawing Sheets

(51) Int. Cl.

| | | |
|---|---|---|
| *H01L 29/786* | (2006.01) | |
| *H01L 37/02* | (2006.01) | |
| *H01L 41/113* | (2006.01) | |
| *G06N 3/04* | (2006.01) | |
| *G11C 11/401* | (2006.01) | |
| *H01L 31/107* | (2006.01) | |
| *H04N 5/374* | (2011.01) | |

(52) U.S. Cl.
CPC .......... *H01L 29/24* (2013.01); *H01L 29/7869* (2013.01); *H01L 29/78648* (2013.01); *H01L 37/02* (2013.01); *H01L 41/1132* (2013.01); *G06N 3/04* (2013.01); *G11C 11/401* (2013.01); *H01L 31/107* (2013.01); *H04N 5/374* (2013.01)

(58) Field of Classification Search
CPC ... H01L 29/7869; H01L 37/02; H01L 41/1132
USPC ........................................................ 327/564
See application file for complete search history.

(56) References Cited

U.S. PATENT DOCUMENTS

| | | |
|---|---|---|
| 2011/0310062 A1 | 12/2011 | Ikeda et al. |
| 2012/0218325 A1 | 8/2012 | Hiroki et al. |
| 2013/0044917 A1 | 2/2013 | Kurokawa |
| 2013/0075594 A1 | 3/2013 | Kozuma |
| 2013/0162778 A1 | 6/2013 | Kurokawa |
| 2013/0241286 A1 | 9/2013 | Yamazaki |
| 2013/0261835 A1 | 10/2013 | Takahashi et al. |
| 2013/0294481 A1 | 11/2013 | Koyama et al. |
| 2013/0326244 A1 | 12/2013 | Koyama et al. |
| 2014/0054466 A1* | 2/2014 | Kurokawa ........... H04N 5/3745 250/362 |
| 2014/0056405 A1 | 2/2014 | Kurokawa et al. |
| 2014/0070079 A1 | 3/2014 | Kurokawa et al. |
| 2014/0085277 A1 | 3/2014 | Iwaki |
| 2014/0121787 A1 | 5/2014 | Yamazaki et al. |
| 2014/0184165 A1 | 7/2014 | Takahashi et al. |
| 2014/0239183 A1 | 8/2014 | Yamazaki et al. |
| 2014/0246667 A1 | 9/2014 | Koyama et al. |
| 2015/0060675 A1 | 3/2015 | Akimoto et al. |
| 2015/0069386 A1 | 3/2015 | Osada |
| 2015/0109201 A1 | 4/2015 | Yamazaki et al. |
| 2015/0263052 A1 | 9/2015 | Yamazaki et al. |
| 2015/0279884 A1 | 10/2015 | Kusumoto |
| 2015/0301636 A1 | 10/2015 | Akimoto et al. |
| 2015/0316958 A1 | 11/2015 | Takesue |
| 2015/0340094 A1 | 11/2015 | Tamura |
| 2015/0340539 A1 | 11/2015 | Koyama |
| 2015/0348975 A1 | 12/2015 | Tamura |
| 2016/0117584 A1 | 4/2016 | Yoneda et al. |
| 2016/0126275 A1 | 5/2016 | Kurokawa |
| 2016/0178409 A1 | 6/2016 | Tsutsui |
| 2016/0284749 A1 | 9/2016 | Kurokawa |
| 2016/0316160 A1 | 10/2016 | Kurokawa |
| 2016/0332493 A1 | 11/2016 | Atsumi et al. |
| 2016/0337607 A1 | 11/2016 | Okamoto et al. |
| 2017/0084649 A1* | 3/2017 | Oh ................... H04N 5/37452 |
| 2017/0154909 A1 | 6/2017 | Ishizu |

FOREIGN PATENT DOCUMENTS

| | | |
|---|---|---|
| JP | 2016-115712 A | 6/2016 |
| WO | WO-2016/092838 | 6/2016 |

OTHER PUBLICATIONS

Written Opinion (Application No. PCT/IB2018/054405) dated Oct. 2, 2018.

Wang.K, "Field-Coupled Thin-Film Transistors for Emerging Non-Display Applications", SID Digest '17 : SID International Symposium Digest of Technical Papers, May 23, 2017, pp. 497-500.

\* cited by examiner $a = x_1 w_1 + x_2 w_2 + b$

SEMICONDUCTOR DEVICE AND ELECTRONIC COMPONENT

CROSS REFERENCE TO RELATED APPLICATIONS

This application is a U.S. National Phase Application under 35 U.S.C. § 371 of International Application PCT/IB2018/054405, filed on Jun. 15, 2018, which is incorporated by reference, and which claims the benefit of a foreign priority application filed in Japan on Jun. 27, 2017, as Application No. 2017-125124.

TECHNICAL FIELD

One embodiment of the present invention relates to a semiconductor device having a sensor function.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Thus, more specifically, a semiconductor device, a display device, a liquid crystal display device, a light-emitting device, a lighting device, a power storage device, a memory device, an imaging device, a driving method thereof, or a manufacturing method thereof can be given as an example of the technical field of one embodiment of the present invention disclosed in this specification.

Note that in this specification and the like, a semiconductor device generally means a device that can function by utilizing semiconductor characteristics. A transistor and a semiconductor circuit are embodiments of semiconductor devices. Furthermore, in some cases, a memory device, a display device, an imaging device, an electronic device, or an electronic component includes a semiconductor device.

BACKGROUND ART

A sensor having a function of converting light into an electric signal has been widely spread and used for a security device, illuminance adjustment of a display device, and the like. An imaging device such as a CMOS image sensor has a configuration in which fine optical sensors are provided two-dimensionally.

Moreover, a sensor that converts not only light but also a mechanical stimulus, heat, magnetism, or the like into an electric signal has also been known. For example, in Non-Patent Document 1, a technique in which a transistor and a material whose electrical characteristics are changed in accordance with a change in its state are combined has been reported.

REFERENCE

Non-Patent Document

[Non-Patent Document 1] Kai Wang, "Field-Coupled Thin-Film Transistor for Emerging Non-Display Applications" SID 2017 DIGEST, pp. 497-500.

SUMMARY OF THE INVENTION

Problems to be Solved by the Invention

In the technique reported in Non-Patent Document 1, an amorphous silicon thin film transistor having a double-gate structure is used. A sensor element is connected to one of gate terminals, and a control electrode is connected to the other of the gate terminals. The sensor element can change a voltage of the one of the gate terminals in accordance with its state. Thus, a factor in changing the state of the sensor element can be read quantitatively from output of the transistor.

However, the amorphous silicon thin film transistor has low mobility and thus is unsuitable for application to a circuit required to be operated at high speed. A signal sensed by the sensor element and output from the transistor may be used as a signal that controls part or the whole of an operation of a system. Therefore, it may affect the operation speed of the system.

The circuit disclosed in Non-Patent Document 1 has a configuration in which a sensed signal is output in real time but preferably retains the signal sensed by the sensor element for a long period of time. Retaining the signal for a long period of time enables highly reliable data to be obtained even when a plurality of sensor elements are operated at the same time, and then a reading operation is sequentially performed. That is, simultaneity in data can be secured.

In view of the above, an object of one embodiment of the present invention is to provide a semiconductor device capable of retaining a signal sensed by a sensor element. Another object is to provide a semiconductor device capable of outputting a signal sensed by a sensor element at high speed.

Another object is to provide a semiconductor device with low power consumption. Another object is to provide a semiconductor device with high reliability. Another object is to provide a novel semiconductor device or the like. Another object is to provide a method for driving the above semiconductor device.

Note that the descriptions of these objects do not disturb the existence of other objects. One embodiment of the present invention does not need to achieve all of these objects. Other objects will be apparent from and can be derived from the description of the specification, the drawings, the claims, and the like.

One embodiment of the present invention relates to a semiconductor device including a sensor element.

One embodiment of the present invention is a semiconductor device including a sensor element, a first transistor, a second transistor, and a third transistor; the sensor element includes a pair of electrodes; the first transistor includes a first gate and a second gate facing the first gate with a semiconductor layer therebetween; one electrode of the sensor element is electrically connected to the first gate; the first gate is electrically connected to one of a source and a drain of the third transistor; one of a source and a drain of the first transistor is electrically connected to a gate of the second transistor; and the semiconductor layer includes a metal oxide.

Another embodiment of the present invention is a semiconductor device including a photodiode, a first transistor, and a second transistor; the first transistor includes a first gate and a second gate facing the first gate with a semiconductor layer therebetween; one electrode of the photodiode is electrically connected to the first gate; one of a source and a drain of the first transistor is electrically connected to a gate of the second transistor; the other of the source and the drain of the first transistor is electrically connected to the other electrode of the photodiode; and the semiconductor layer includes a metal oxide.

In each of the above two embodiments of the present invention, a capacitor may be further included, and one electrode of the capacitor may be electrically connected to the gate of the second transistor. Furthermore, the configuration, an inverter circuit, and a counter circuit may be included, an output terminal of the inverter circuit may be electrically connected to the other of a source and a drain of the second transistor, an input terminal of the inverter circuit may be electrically connected to one of the source and the drain of the second transistor, and an input terminal of the counter circuit may be electrically connected to the input terminal of the inverter circuit.

In each of the above two embodiments of the present invention including a capacitor, a fourth transistor may be further included, and one of a source and a drain of the fourth transistor may be electrically connected to the one of the source and the drain of the second transistor. Furthermore, the configuration, a shift register circuit, and an A/D converter circuit may be included, a gate of the fourth transistor may be electrically connected to the shift register circuit, and the other of the source and the drain of the fourth transistor may be electrically connected to the A/D converter circuit.

Another embodiment of the present invention is a semiconductor device in which an odd number of circuit blocks are connected in series, and an input terminal in a first stage and an output terminal in a last stage are electrically connected to each other, where the circuit block includes an inverter circuit and a delay circuit; the delay circuit includes a sensor element, a first transistor, a second transistor, and a third transistor; the sensor element includes a pair of electrodes; the first transistor includes a first gate and a second gate facing the first gate with a semiconductor layer therebetween; one electrode of the sensor element is electrically connected to the first gate; the first gate is electrically connected to one of a source and a drain of the third transistor; the second gate is electrically connected to one of a source and a drain of the second transistor; one of a source and a drain of the first transistor is electrically connected to an output terminal of the inverter circuit; the semiconductor layer includes a metal oxide; an input terminal of the inverter circuit is an input terminal of the circuit block; and the other of the source and the drain of the first transistor is an output terminal of the circuit block.

The sensor element may be shared by all the circuit blocks. The third transistor may be shared by all the circuit blocks.

In the above embodiment of the present invention including a sensor element, as the sensor element, a photoelectric conversion element, a piezoelectric element, or a heat sensitive element is preferably used.

In each of the above embodiments of the present invention including the metal oxide, the metal oxide preferably includes In, Zn, and M (M is Al, Ti, Ga, Sn, Y, Zr, La, Ce, Nd, or Hf).

Effect of the Invention

With the use of one embodiment of the present invention, a semiconductor device capable of retaining a signal sensed by a sensor element can be provided. A semiconductor device capable of outputting a signal sensed by a sensor element at high speed can be provided.

A semiconductor device with low power consumption can be provided. A highly reliable semiconductor device can be provided. A novel semiconductor device or the like can be provided. A method for driving the above semiconductor device can be provided.

MODE FOR CARRYING OUT THE INVENTION

Figure 1:
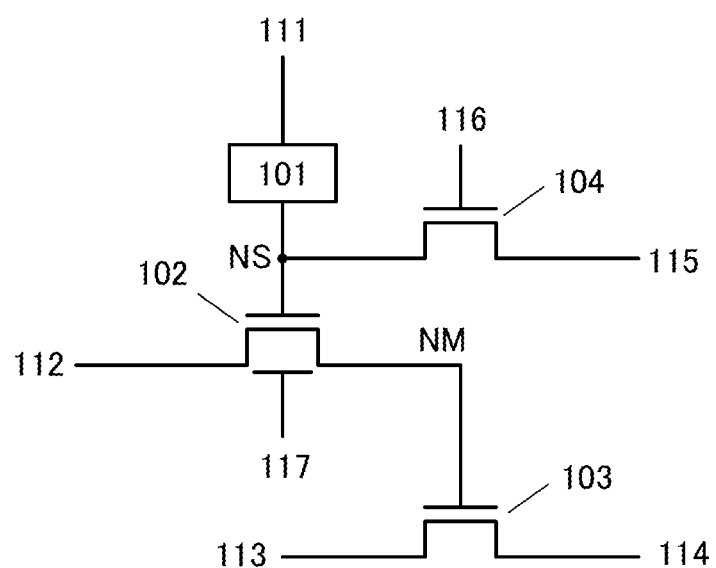
FIG. 1 A circuit diagram showing a semiconductor device.

Embodiments will be described in detail with reference to the drawings. Note that the present invention is not limited to the following description, and it will be readily understood by those skilled in the art that modes and details of the present invention can be modified in various ways without departing from the spirit and scope. Therefore, the present invention should not be interpreted as being limited to the description of embodiments below. Note that in structures of the invention described below, the same reference numerals are used, in different drawings, for the same portions or portions having similar functions, and description thereof is not repeated in some cases. Note that the hatching of the same element that constitutes a drawing is omitted or changed in different drawings in some cases.

Embodiment 1

In this embodiment, a semiconductor device which is one embodiment of the present invention will be described with reference to drawings.

One embodiment of the present invention is a semiconductor device including a sensor element and a plurality of transistors. The sensor element outputs a first signal to a gate of a first transistor in accordance with its state. The first transistor outputs a second signal to a gate of a second transistor in response to the first signal. The gate of the second transistor functions as a retaining node. The second transistor outputs a third signal in response to the second signal. In other words, in the semiconductor device of one embodiment of the present invention, a signal including the quantitative data of a factor in changing the state of the sensor element can be output.

The second signals can be retained, whereby simultaneous reading of the second signals from a plurality of semiconductor devices can be ensured even in the case where the second signals are read from the plurality of semiconductor devices. Furthermore, the retaining node of the second signal is in a floating state, and the maximum value of the second signal output during a certain period can be retained.

FIG. 1 is a circuit diagram illustrating a semiconductor device of one embodiment of the present invention. The semiconductor device includes a sensor element 101, a transistor 102, a transistor 103, and a transistor 104. Here, the sensor element includes a pair of electrodes. The transistor 102 includes a first gate and a second gate.

One electrode of the sensor element 101 is electrically connected to the first gate of the transistor 102, and the first gate of the transistor 102 is electrically connected to one of a source and a drain of the transistor 104. One of a source and a drain of the transistor 102 is electrically connected to a gate of the transistor 103.

Here, a point at which the one electrode of the sensor element 101, the gate of the transistor 102, and the one of the source and the drain of the transistor 104 are connected to each other is referred to as a node NS. Moreover, a point at which the one of the source and the drain of the transistor 102 and the gate of the transistor 103 are connected to each other is referred to as a node NM.

The other electrode of the sensor element 101 is electrically connected to a wiring 111. The other of the source and the drain of the transistor 102 is electrically connected to a wiring 112. The second gate of the transistor 102 is electrically connected to a wiring 117. One of a source and a drain of the transistor 103 is electrically connected to a wiring 113. The other of the source and the drain of the transistor 103 is electrically connected to a wiring 114. The other of the source and the drain of the transistor 104 is electrically connected to a wiring 115.

The wiring 111 can function as a power supply line that supplies an appropriate voltage for driving the sensor element. The voltage varies depending on the kind of a sensor, a power supply voltage VDD of a circuit can be used in some cases, and a voltage exclusively for a sensor element (also including a negative potential) is used in some cases.

The wiring 112, the wiring 113, and the wiring 115 can function as power supply lines. The wiring 116 and the wiring 117 can function as signal lines which control the electrical conduction of the respective transistors. The wiring 114 can function as an output line. Note that the function of the wiring 113 and the function of the wiring 114 can be interchanged.

Figure 2A:
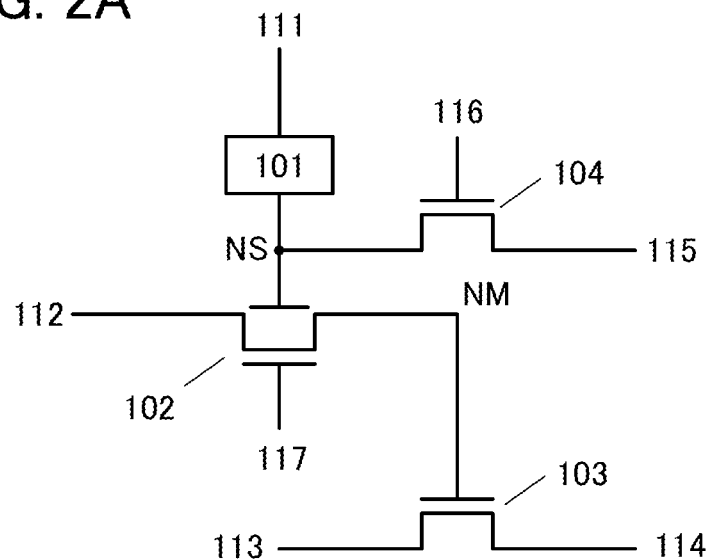
FIGS. 2A and 2B Circuit diagrams showing semiconductor devices.

Although FIG. 1 shows an example in which the sensor element 101 is electrically connected to the first gate (front gate) of the transistor 102, and the wiring 117 is connected to the second gate (back gate) of the transistor 102, the connection modes may be reversed as illustrated in FIG. 2(A). Although the mode of FIG. 1 is mainly used in the other drawings in this specification, the circuit illustrated in FIG. 1 and the circuit illustrated in FIG. 2(A) can be basically regarded as being equivalent. Note that the configuration of the transistor is actually asymmetric with respect to a semiconductor layer; therefore, appropriate conditions for operating the circuit may vary.

As the sensor element 101, an element that can change the potential of an output destination, such as a photoelectric conversion element, a piezoelectric element, or a heat sensitive element, is preferably used. Furthermore, an element that changes a potential by magnetism, a chemical change, or a biological activity may be used.

As the photoelectric conversion element, a photodiode, which is a non-linear element, or a photoconductor, which is a linear element, can be used.

As the photodiode, a pn-junction photodiode or a pin-junction photodiode can be used, for example. As a material of a photoelectric conversion layer in the photodiode, typically, Si (single crystal silicon, polycrystalline silicon, microcrystalline silicon, amorphous silicon, or the like) can be used. An avalanche photodiode using Se or a Se compound may also be used.

As the photoconductor, an element containing a material that changes electrical resistance between two terminals in accordance with light intensity can be used. As the material, for example, Si, InGaAs, ZnO, InSb, chalcogenide, an OPC (organic compound photoconductor), or the like can be used.

As a piezoelectric element, an element including a piezoelectric substance between two terminals can be used. A piezoelectric element is an element that generates electric charge when a pressure is rapidly applied. As a piezoelectric substance, for example, in addition to an inorganic material such as $BaTiO_3$, $PbTiO_3$, or $Pb(Zr, Ti)O_3$ (PZT), an organic material such as PVDF (polyvinylidene fluoride) or PVDF-TrFE (polyvinylidene fluoride-trifluoroethylene copolymer) can be used.

Note that the above piezoelectric element also has pyroelectric characteristics of generating electric charge when the temperature changes. Therefore, a material that can be used as the above piezoelectric element can also be used as a heat sensitive element. Moreover, the organic material such as PVDF (polyvinylidene fluoride) or PVDF-TrFE (polyvinylidene fluoride-trifluoroethylene copolymer) is a material whose dielectric constant has high temperature dependence, and thus a change in temperature can be also sensed using the characteristics.

The transistor 102 has a function of writing, to the node NM, a signal potential output by the sensor element 101, a function of retaining the potential of the node NM, and a function of resetting the potential of the node NM. The transistor 102 can be regarded as a source follower circuit and can write the potential of the node NS to the node NM in the case where the transistor 102 is turned on by the potential of the first gate.

The node NM is in a floating state, and thus the written potential is retained as long as resetting is not performed. Note that in the case where the potential of the node NS is increased, the potential of the node NS can be overwritten to the node NM. Thus, the maximum value of the node NS during a desired certain period can be stored in the node NM.

Note that when a signal potential is written to the node NM, the potential of the wiring 112 is set to a high potential. In order to reset the potential of the node NM, the potential of the wiring 112 is set to a low potential, the potential of the wiring 117 is set to a high potential, and the transistor 102 is turned on by the potential of the second gate.

The transistor 103 has a function of outputting the potential of the node NM to the wiring 114. The transistor 103 can be regarded as a source follower circuit and can output the potential of the node NM to the wiring 114 when a high potential is supplied to the wiring 113. Note that in the above description, the threshold voltages of the transistors 102 and 103 are sufficiently low and negligible.

The transistor 104 has a function of resetting the potential of the node NS. The wiring 115 is set to a low potential and the transistor 104 is turned on, whereby the node NS can be set to a reset potential. At this time, the transistor 102 is turned off, so that the potential of the node NM is retained. Note that even in the case where the potential of the node NS is not set to the reset potential, the potential of the wiring 117 is made sufficiently small (a negative potential, for example), whereby the transistor 102 can be turned off.

Figure 2B:
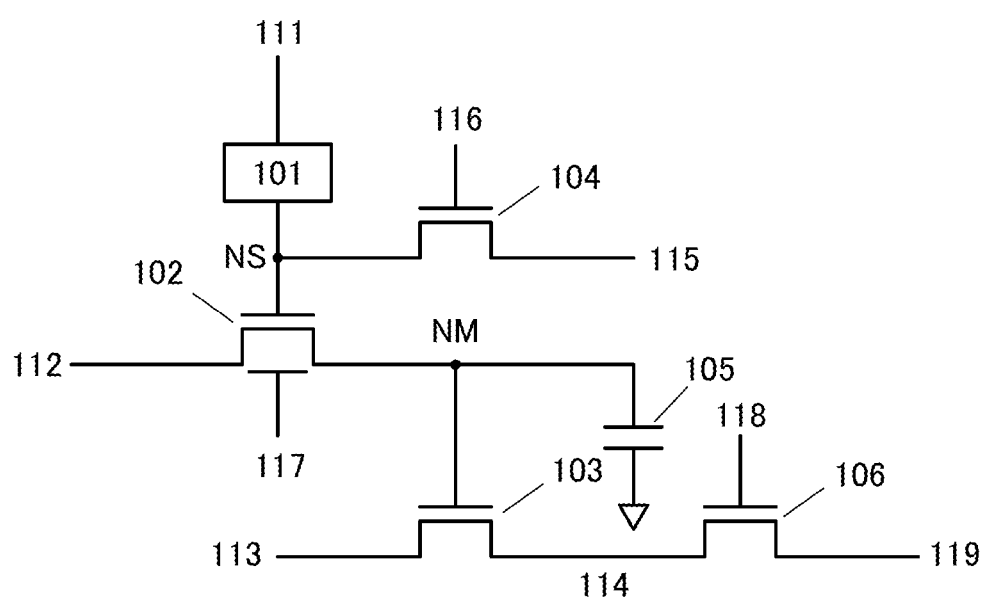

As illustrated in FIG. 2(B), a capacitor 105 may be provided in the semiconductor device. When one electrode of the capacitor 105 is connected to the node NM, the potential retention capability of the node NM can be increased. Moreover, at the time of performing resetting and the like, a change in the potential of the node NM due to a change in the potential of the node NS can be made small.

In addition, a transistor 106 electrically connected to the wiring 114 may be provided. One of a source and a drain of the transistor 106 is electrically connected to the wiring 114, and the other of the source and the drain of the transistor 106 is electrically connected to a wiring 119. A gate of the transistor 106 is electrically connected to a wiring 118. The transistor 106 can function as a selection transistor and output, to the wiring 119, a signal output by the transistor 103 by input of a selection signal to the wiring 118. Note that the transistor 106 may be provided between the wiring 113 and the transistor 103.

Here, a transistor using a metal oxide in a channel formation region (hereinafter, OS transistor) is preferably used for at least the transistor 102 and the transistor 104. The OS transistor has a small off-state current, and thus unnecessary inflow and outflow of electric charge at the node NS and the node NM can be suppressed.

The field-effect mobility of the OS transistor is 10 cm$^2$/Vs to 100 cm$^2$/Vs, and is substantially the same as that of a polycrystalline silicon transistor. Accordingly, the OS transistor can be driven at a higher speed than an amorphous silicon transistor, and even when the semiconductor device of one embodiment of the present invention is one component of a system, it is not likely to limit the operation speed of the system.

Next, a specific circuit configuration of a semiconductor device including the circuit configuration in FIG. 1 and the operation thereof will be described.

Configuration Example 1

Figure 3A:
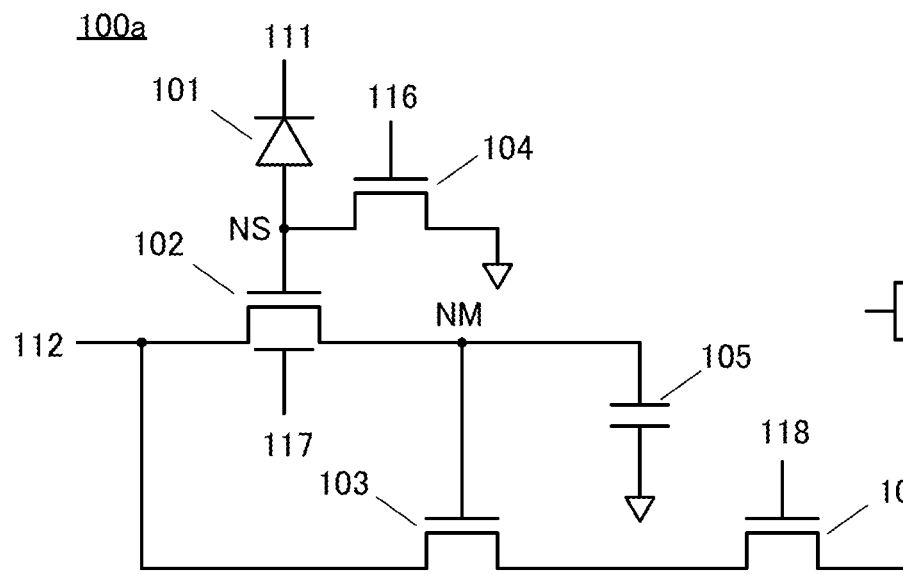
FIGS. 3A-3D Circuit diagrams and timing charts showing semiconductor devices.
Figure 3B:
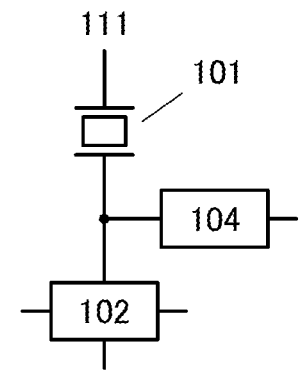

FIG. 3(A) is a circuit diagram of a semiconductor device 100a in which the potential of the node NS is not reversibly changed in response to the operation of the sensor element 101. For example, a photoelectric conversion element can be used as the sensor element 101. Alternatively, a piezoelectric element or a heat sensitive element can be used as illustrated in FIG. 3(B). When a photodiode is used as a photoelectric conversion element, an anode of the photodiode is electrically connected to the node NS.

The configuration of the semiconductor device 100a is substantially the same as the configuration of the circuit illustrated in FIG. 2(B). Note that in FIG. 3(A), the one of the source and the drain of the transistor 103 is electrically connected to the other of the source and the drain of the transistor 102. In other words, the power supply wiring is shared.

An example of an operation of the semiconductor device 100a will be described with reference to timing charts shown in FIGS. 3(C) and 3(D). Note that during operation periods in the timing charts shown in FIGS. 3(C) and 3(D), a high potential is constantly supplied to the wiring 111. At each wiring, a high potential is denoted by "H" and a low potential is denoted by "L". As the high potential "H", for example, the power supply voltage VDD can be used. As the low potential "L", for example, a power supply voltage VSS, 0 V, or a GND potential can be used. Note that a negative potential is used for the wiring 117 in some cases, a potential corresponding to a high potential is represented by "+V", and a potential corresponding to a low potential is represented by "0", and a negative potential is represented by "−V". Note that the potential "0" is not limited to 0 V and may be the GND potential or a potential for adjusting the threshold voltage of the transistor 102.

First, an operation of performing reading every sensing period will be described with reference to the timing chart in FIG. 3(C). Since the potential of the node NS is not reversibly changed in the semiconductor device 100a, the potential of the node NS may be saturated. Accordingly, the potential of the node NS needs to be periodically reset so as not to be saturated.

Before Period T1, the potential of the wiring 112 is set to "L", the potential of the wiring 117 is set to "+V", and the potential of the wiring 116 is set to "H". The potential of the wiring 117 is set to "+V", whereby the transistor 102 is brought into a conduction state, and the node NM is reset to a potential "L" of the wiring 112. Furthermore, the potential of the wiring 116 is set to "H", whereby the transistor 104 is turned on, and the potential of the node NS is reset to "L".

When in Period T1, the potential of the wiring 112 is set to "H", the potential of the wiring 117 is set to "0", and the potential of the wiring 116 is set to "L", first, the potential of the node NS is increased by an operation of the sensor element 101, the transistor 102 is turned on, and the potential of the node NM is also increased. Period T1 corresponds to a sensing period.

When the potential of the wiring 116 is set to "H" in Period T2, the potential of the node NS is reset, and the transistor 102 is turned off. Accordingly, the potential of the node NM is retained.

In Period T2, instead of setting the potential of the wiring 116 to "H", the potential of the wiring 117 may be set to "−V" as indicated by the dashed line. When the potential of the wiring 117 is set to "−V", the transistor 102 can be turned off regardless of the potential of the node NS, and thus the potential of the node NM can be retained. In this case, the potential of the node NS continues to be increased in accordance with the operation of the sensor element 101 and then is saturated. Note that in Period T2, the potential of the wiring 116 may be set to "H" and the potential of the wiring 117 may be set to "−V".

When the potential of the wiring 118 is set to "H" in Period T3, the transistor 106 is turned on, and the potential retained in the node NM can be read to the wiring 119. By repeating the above operation, a signal sensed by the sensor element 101 in Period T1 can be read periodically.

Next, with reference to FIG. 3(D), an operation of performing reading every plural sensing periods will be described. A user determines the maximum value of a signal sensed by the sensor element 101 in a given period in some cases. The maximum value can be selected from the obtained signals also in the operation of FIG. 3(C), which is not efficient in the case where only the maximum value is needed.

Figure 3C:
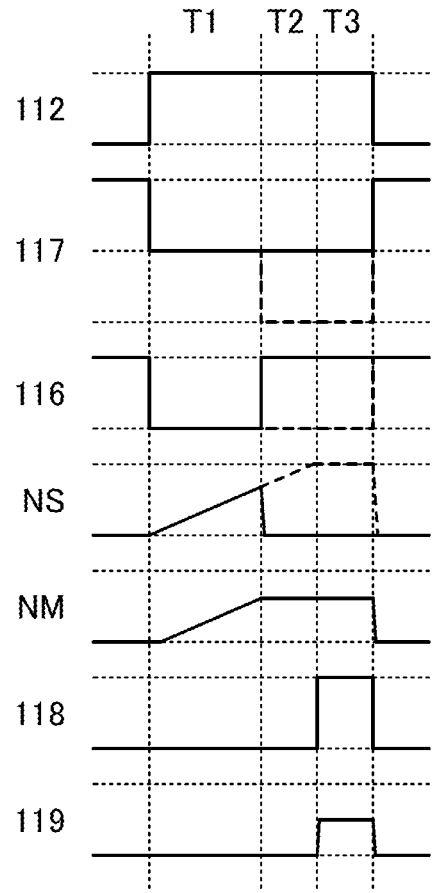
Figure 3D:
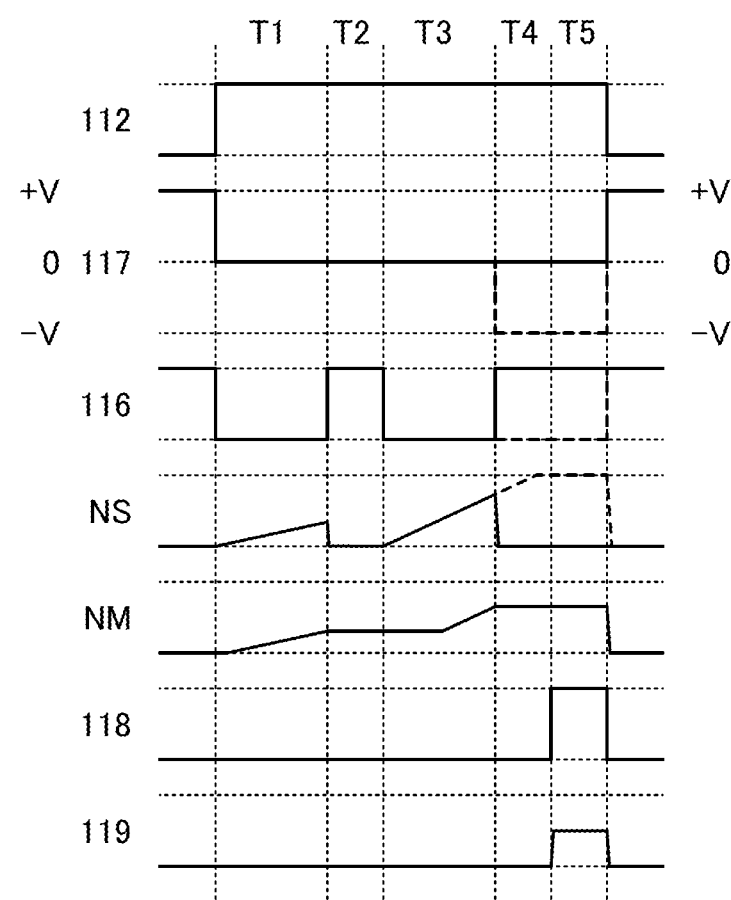

The operation up to Period T1 is similar to that in the description of FIG. 3(C).

In Period T2, the potential of the wiring 116 is set to "H", and the potential of the node NS is reset. At this time, a signal obtained in Period T1 is retained in the node NM.

When the potential of the wiring 116 is set to "L" in Period T3, the potential of the node NS is increased, and when the potential of the node NS becomes higher than the potential of the node NS in Period T1, the retained potential of the node NM is further increased from the retained potential. Accordingly, a signal potential corresponding to the maximum value of a signal potential obtained by the sensor element 101 in Period T1 and Period T3 is written to the node NM. Period T3 also corresponds to a sensing period.

The operation at and after Period T4 is similar to that in the description at and after Period T2 of FIG. 3(C).

The potential of the node NS is reset between the sensing periods as described above, whereby the maximum value of the signal potential obtained by the sensor element 101 can be obtained. Note that there is no limitation on the number of sensing periods as long as the potential of the node NS is not saturated.

Configuration Example 2

Figure 4A:
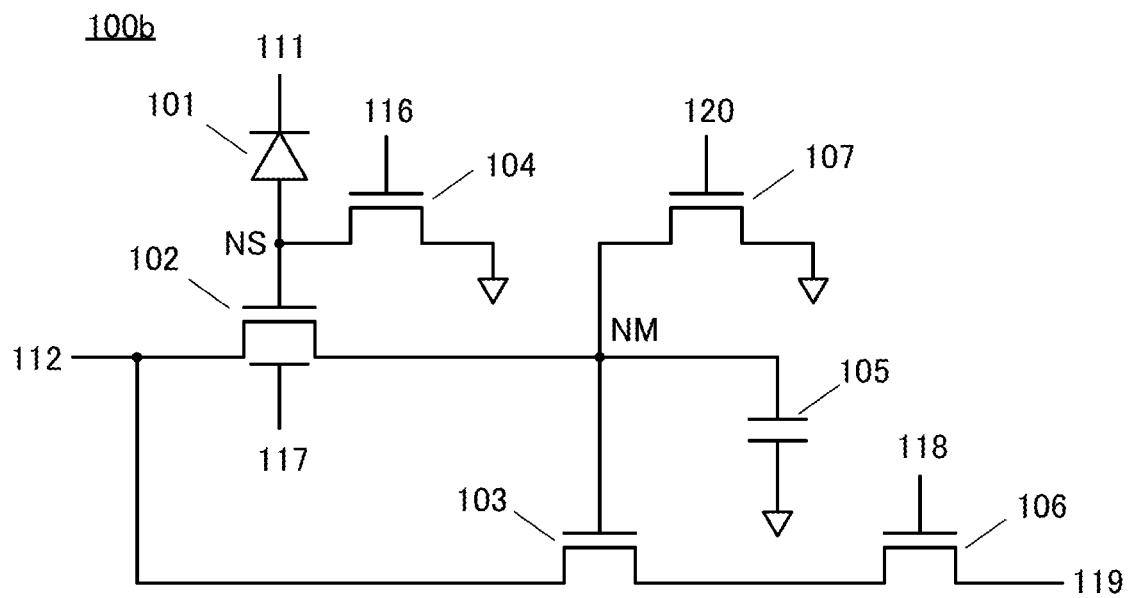
FIGS. 4A-4C A circuit diagram and timing charts showing a semiconductor device.

FIG. 4(A) is a circuit diagram of a semiconductor device 100b, which is a modification example of the semiconductor device 100a illustrated in FIG. 3(A).

The semiconductor device 100b has a configuration in which the semiconductor device 100a is provided with a transistor 107. One of a source and a drain of the transistor 107 is electrically connected to the node NM. With this configuration, a reset operation of the node NM can be performed with the transistor 107; therefore, the wiring 112 can be fixed at a high potential. In other words, a mechanism that changes the power supply potential to be supplied to the wiring 112 can be unnecessary.

Figure 4B:
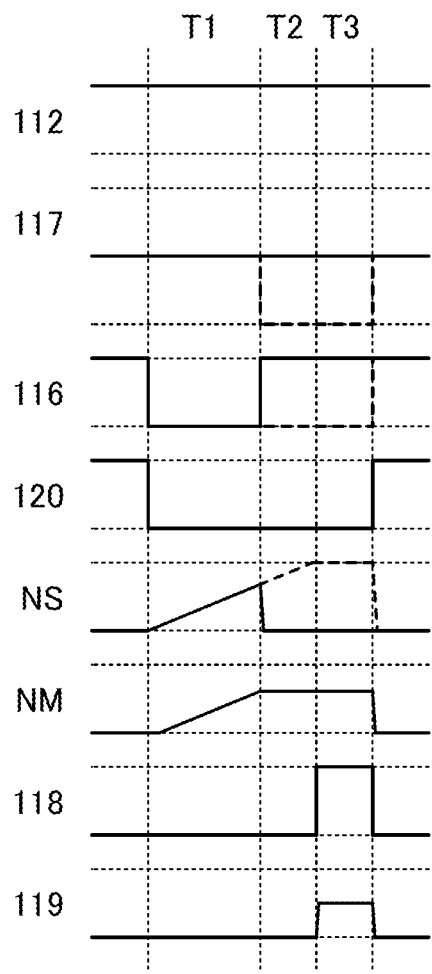

An example of an operation of the semiconductor device 100b will be described with reference to timing charts shown in FIGS. 4(B) and 4(C). The same description as that of the semiconductor device 100a is omitted.

An operation of performing reading every sensing period will be described with reference to the timing chart in FIG. 4(B).

Before Period T1, the potential of the wiring 117 is set to "0", the potential of the wiring 116 is set to "H", and the potential of the wiring 120 is set to "H". The potential of the wiring 116 is set to "H", whereby the transistor 104 is turned on, and the potential of the node NS is reset to "L". Furthermore, the potential of the wiring 120 is set to "H", whereby the transistor 107 is turned on, and the potential of the node NM is reset to "L".

When in Period T1, the potential of the wiring 116 is set to "L" and the potential of the wiring 120 is set to "L", first, the potential of the node NS is increased by an operation of the sensor element 101, the transistor 102 is turned on, and the potential of the node NM is also increased.

When the potential of the wiring 116 is set to "H" in Period T2, the potential of the node NS is reset, and the transistor 102 is turned off. Accordingly, the potential of the node NM is retained.

In Period T2, instead of setting the potential of the wiring 116 to "H", the potential of the wiring 117 may be set to "−V" as indicated by the dashed line. When the potential of the wiring 117 is set to "−V", the transistor 102 can be turned off regardless of the potential of the node NS, and thus the potential of the node NM can be retained. In this case, the potential of the node NS continues to be increased in accordance with the operation of the sensor element 101 and then is saturated. Note that in Period T2, the potential of the wiring 116 may be set to "H" and the potential of the wiring 117 may be set to "−V".

When the potential of the wiring 118 is set to "H" in Period T3, the transistor 106 is turned on, and the potential retained in the node NM can be read to the wiring 119. By repeating the above operation, a signal sensed by the sensor element 101 in Period T1 can be read periodically.

Figure 4C:
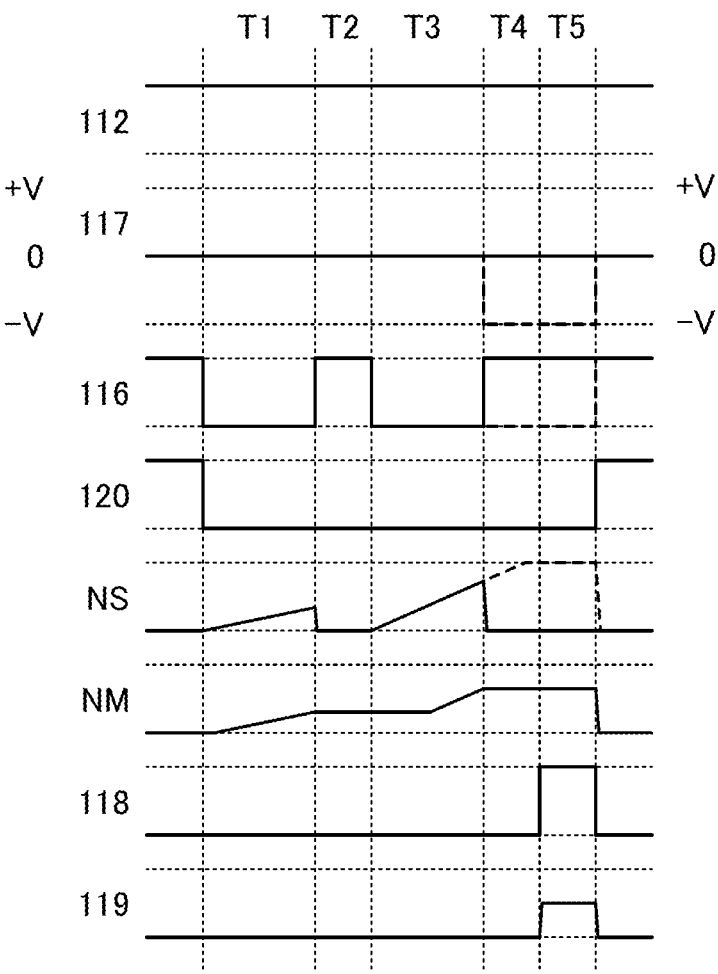

FIG. 4(C) is a timing chart showing an operation of performing reading every plural sensing periods. The basic operation is similar to that in FIG. 4(B), and in a manner similar to that of the description of FIG. 3(D), the potential of the node NS is reset between the sensing periods, whereby the maximum value of the signal potential obtained by the sensor element 101 can be output regardless of the number of the sensing periods.

Configuration Example 3

Figure 5A:
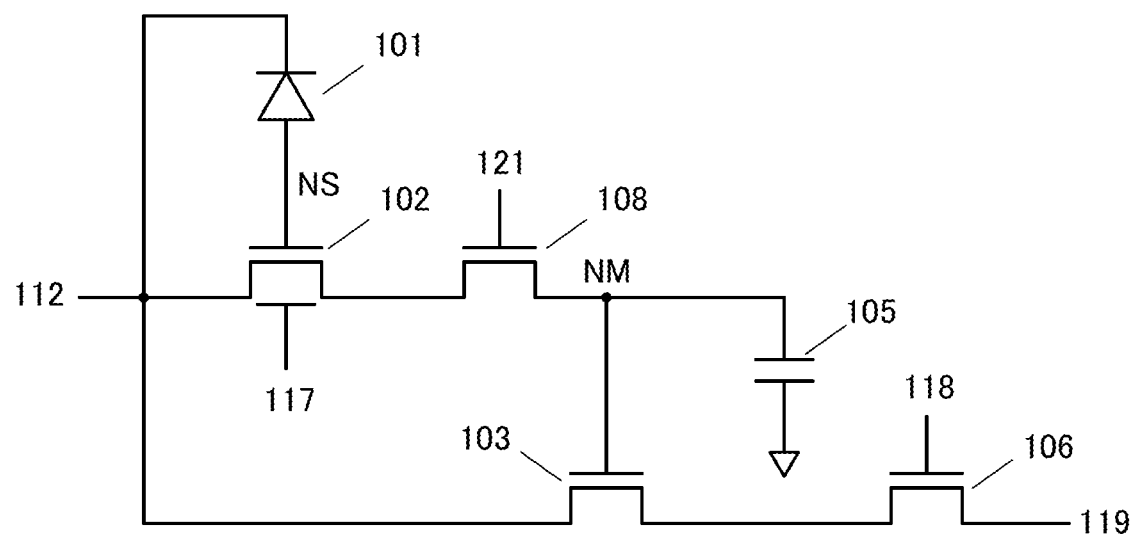
FIGS. 5A-5C A circuit diagram and timing charts showing a semiconductor device.

FIG. 5(A) is a circuit diagram of a semiconductor device 100c in which a transistor for resetting the node NS is omitted. In the configuration, the reset operation of the node NS is performed through the sensor element 101, and thus the sensor element 101 is limited to an element having non-linear characteristics. For example, a photodiode can be used as the sensor element 101, and an anode of the photodiode is electrically connected to the node NS. A cathode of the photodiode can be electrically connected to the wiring 112, and thus one of the power supply lines can be omitted.

The semiconductor device 100c has a configuration in which the transistor 104 in the semiconductor device 100a is omitted and a transistor 108 is provided. One of a source and a drain of the transistor 108 is electrically connected to the one of the source and the drain of the transistor 102, and the other of the source and the drain of the transistor 108 is electrically connected to the node NM. With this configuration, the transistor 108 is turned off regardless of the operation of the transistor 102, whereby the potential of the node NM can be retained.

Figure 5B:
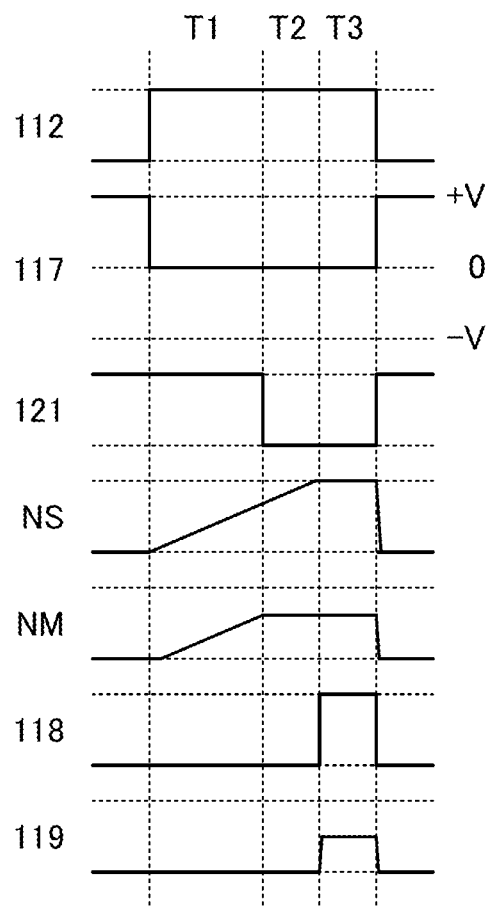

An operation of performing reading every sensing period will be described with reference to the timing chart in FIG. 5(B).

Before Period T1, the potential of the wiring 112 is set to "L", the potential of the wiring 117 is set to "+V", and the potential of the wiring 121 is set to "H". The potential of the wiring 117 is set to "+V", whereby the transistor 102 is brought into a conduction state, and the node NM is reset to the potential "L" of the wiring 112. Furthermore, a forward bias is applied to the sensor element 101 (photodiode), and thus the potential of the node NS is reset to "L".

When in Period T1, the potential of the wiring 112 is set to "H" and the potential of the wiring 117 is set to "0", the sensor element 101 is operated, the potential of the node NS is increased, the transistor 102 is turned on, and the potential of the node NM is also increased.

When the potential of the wiring 121 is set to "L" in Period T2, the transistor 108 is turned off. Accordingly, the potential of the node NM is retained.

When the potential of the wiring 118 is set to "H" in Period T3, the transistor 106 is turned on, and the potential retained in the node NM can be read to the wiring 119. By repeating the above operation, a signal sensed by the sensor element 101 in Period T1 can be read periodically.

Figure 5C:
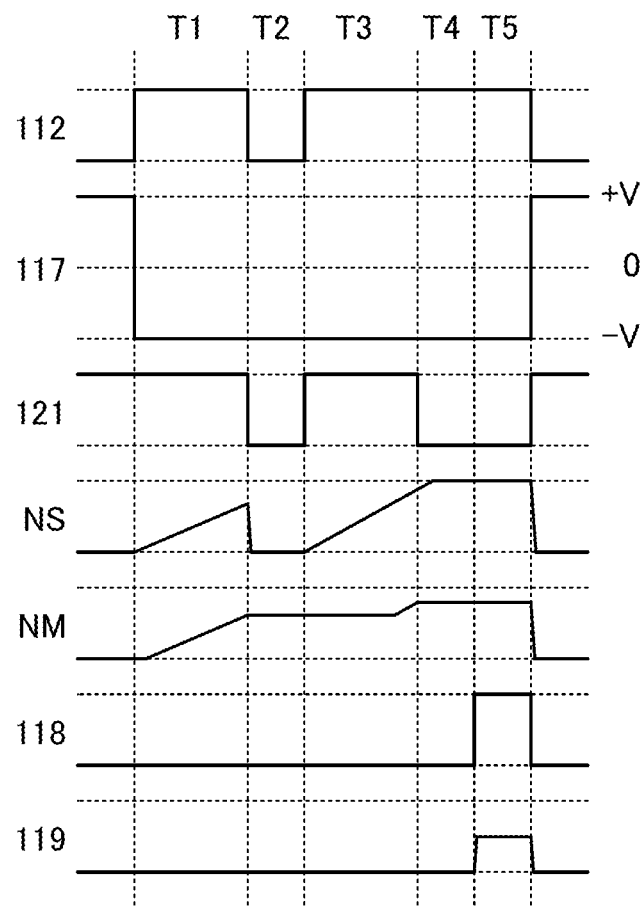

FIG. 5(C) is a timing chart showing an operation of performing reading every plural sensing periods. The basic operation is similar to that in FIG. 5(B), and in a manner similar to that of the description of FIG. 3(D), the potential of the node NS is reset between the sensing periods, whereby the maximum value of the signal potential obtained by the sensor element 101 can be output regardless of the number of the sensing periods.

Configuration Example 4

Figure 6A:
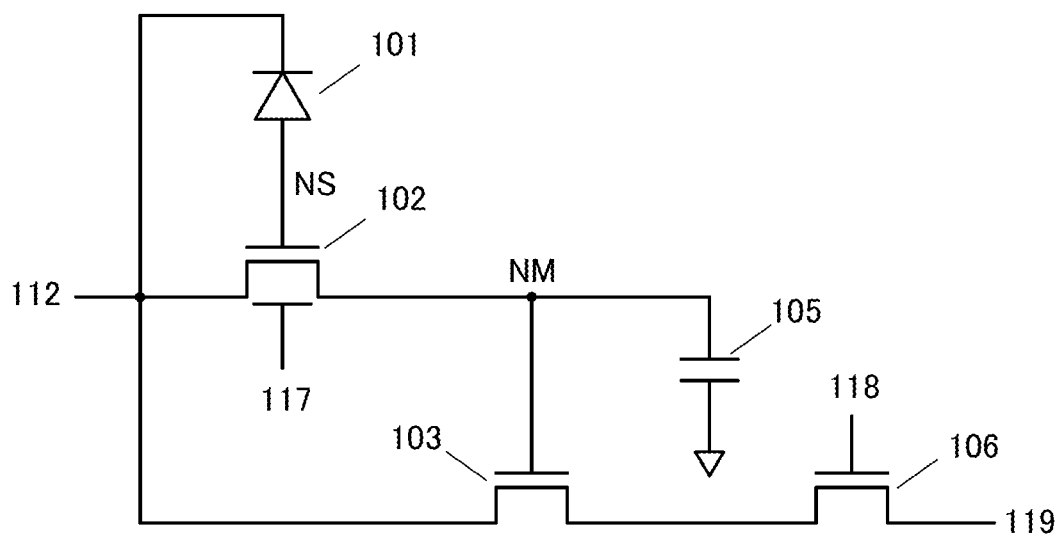
FIGS. 6A-6C A circuit diagram and timing charts showing a semiconductor device.

FIG. 6(A) is a circuit diagram of a semiconductor device 100d, which is a modification example of the semiconductor device 100c illustrated in FIG. 5(A).

The semiconductor device 100d has a configuration in which the transistor 108 is omitted from the semiconductor device 100c. With this configuration, the transistor 102 is turned off, whereby the potential of the node NM can be retained.

Figure 6B:
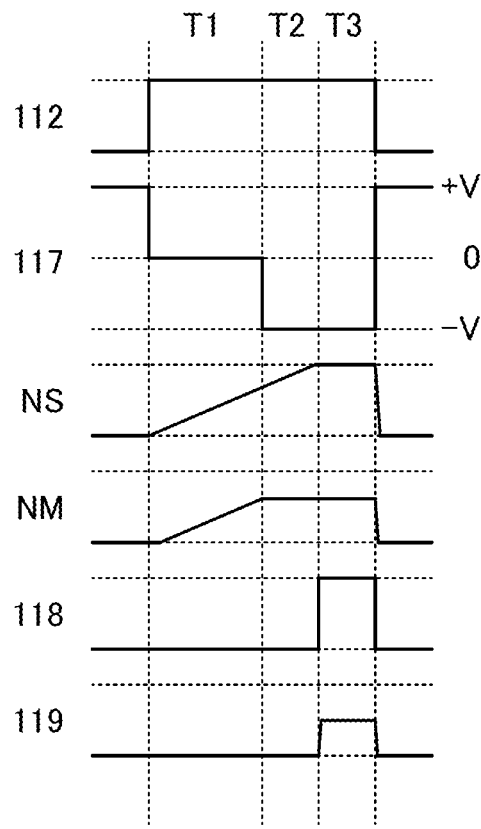

An operation of performing reading every sensing period will be described with reference to the timing chart in FIG. 6(B).

Before Period T1, the potential of the wiring 112 is set to "L", and the potential of the wiring 117 is set to "+V". The potential of the wiring 117 is set to "+V", whereby the transistor 102 is brought into a conduction state, and the node NM is reset to the potential "L" of the wiring 112. Furthermore, a forward bias is applied to the sensor element 101 (photodiode), and thus the potential of the node NS is reset to "L".

When in Period T1, the potential of the wiring 112 is set to "H" and the potential of the wiring 117 is set to "0", the sensor element 101 is operated, the potential of the node NS is increased, and accordingly, the potential of the node NM is also increased.

When in Period T2, the potential of the wiring 112 is set to "L" and the potential of the wiring 117 is set to "–V", the transistor 102 is turned off. Accordingly, the potential of the node NM is retained.

When the potential of the wiring 118 is set to "H" in Period T3, the transistor 106 is turned on, and the potential retained in the node NM can be read to the wiring 119. By repeating the above operation, a signal sensed by the sensor element 101 in Period T1 can be read periodically.

Figure 6C:
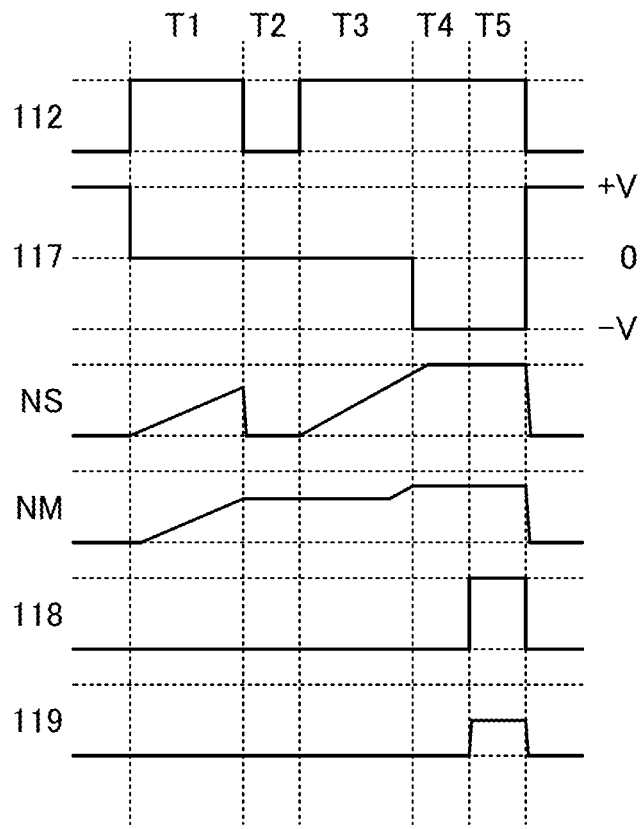

FIG. 6(C) is a timing chart showing an operation of performing reading every plural sensing periods. The basic operation is similar to that in FIG. 6(B), and in a manner similar to that of the description of FIG. 3(D), the potential of the node NS is reset between the sensing periods, whereby the maximum value of the signal potential obtained by the sensor element 101 can be output regardless of the number of the sensing periods.

Configuration Example 5

Figure 7A:
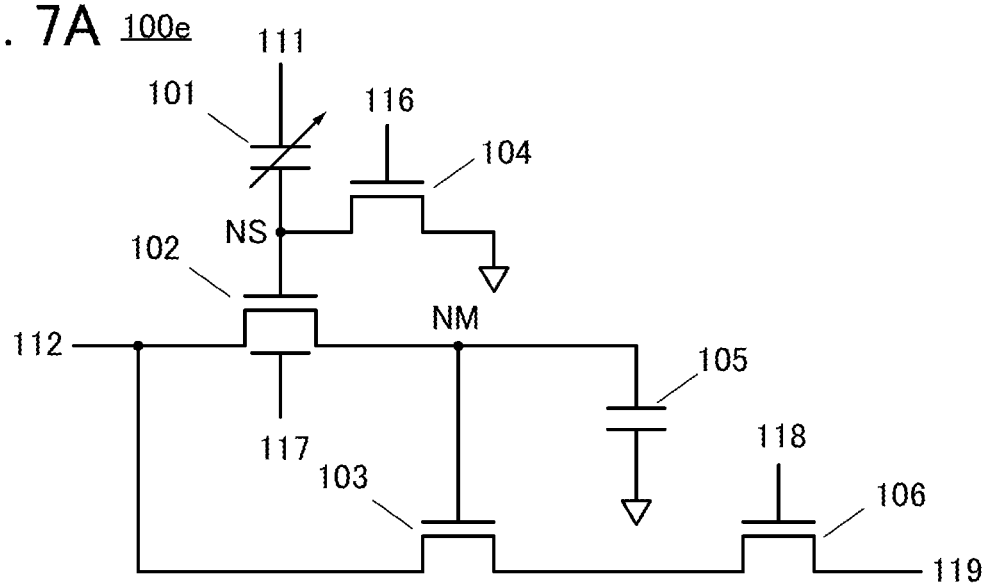
FIGS. 7A and 7B A circuit diagram and a timing chart showing a semiconductor device.

FIG. 7(A) is a circuit diagram of a semiconductor device 100e in which the potential of the node NS is reversibly changed in response to the operation of the sensor element 101. For example, an element whose capacitance value is changed in accordance with its state can be used as the sensor element 101. Specifically, a variable capacitor in which the above organic material such as PVDF (polyvinylidene fluoride) whose dielectric constant has high temperature dependence or PVDF-TrFE (polyvinylidene fluoride-trifluoroethylene copolymer) is included between a pair of electrodes can be given, for example. In the variable capacitor, the dielectric constant is also increased with a rise in temperature in a specific temperature range.

In FIG. 7(A), the potential of the node NS is determined by the potential of the wiring 111 and the capacitance ratio between the capacitance of the sensor element 101 and the gate capacitance of the transistor 102. In the case where the capacitance value of the sensor element 101 is increased from a specific steady state, the capacitive coupling through the sensor element 101 becomes large, and thus, the potential of the node NS becomes closer to a voltage supplied to the wiring 111. Accordingly, when the voltage supplied to the wiring 111 is a potential lower than the potential of the node NS (e.g., a negative potential), the temperature is increased, and the capacitance value of the sensor element 101 becomes high, whereby the potential of the node NS is reduced. When the voltage supplied to the wiring 111 is a potential higher than the potential of the node NS, the temperature is increased and the capacitance value of the sensor element 101 becomes large, whereby the potential of the node NS is increased.

The configuration of the semiconductor device 100e can be similar to that of the semiconductor device 100a except the sensor element 101. One electrode of the sensor element 101 is electrically connected to the node NS, and the other electrode of the sensor element 101 is electrically connected to the wiring 111. The sensor element 101 has no polarity.

Figure 7B:
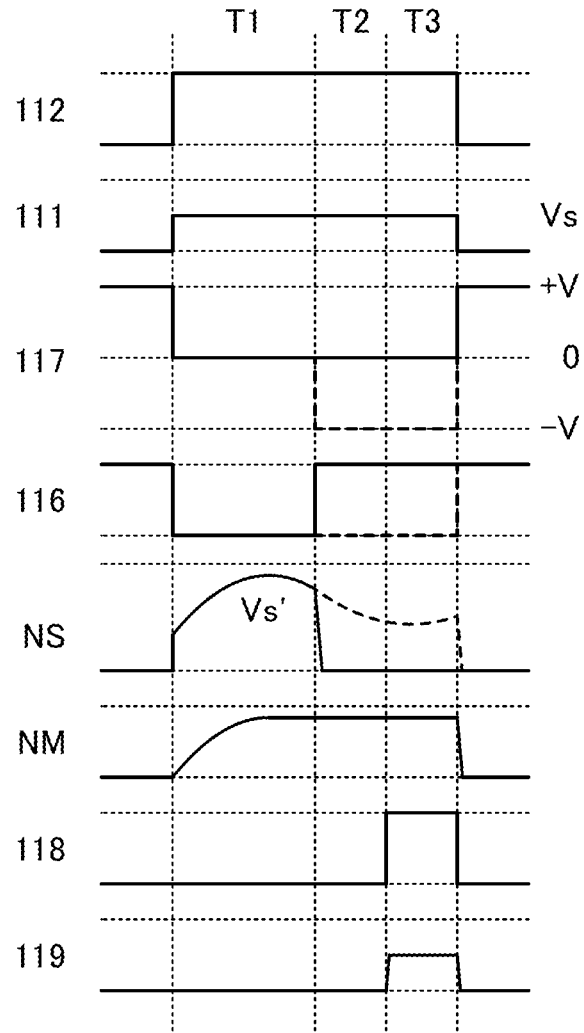

A reading operation of the semiconductor device 100e will be described with reference to a timing chart in FIG. 7(B). Note that since the potential of the node NS is reversible unlike in the semiconductor device 100a and the like, a regular reset operation is unnecessary.

Before Period T1, the potential of the wiring 112 is set to "L", the potential of the wiring 111 is set to "L", the potential of the wiring 117 is set to "+V", and the potential of the wiring 116 is set to "H". The potential of the wiring 117 is set to "+V", whereby the transistor 102 is brought into a conduction state, and the node NM is reset to the potential "L" of the wiring 112. Furthermore, the potential of the wiring 116 is set to "H", whereby the transistor 104 is turned on, and the potential of the node NS is reset to "L".

In Period T1, first, the potential of the wiring 112 is set to "H", the potential of the wiring 111 is set to "Vs", the potential of the wiring 117 is set to "0", and the potential of the wiring 116 is set to "L". Here, the potential "Vs" of the wiring 111 is an appropriate voltage applied to the sensor element 101. In Period T1, when the sensor element 101 senses a temperature change, a potential Vs' of the node NS changes according to the temperature change. The potential of the node NM is increased with a rise in the potential Vs' of the node NS, and after that, in the case where the potential Vs' of the node NS is decreased, the maximum value is retained.

When the potential of the wiring 116 is set to "H" in Period T2, the potential of the node NS is reset, and the transistor 102 is turned off. Accordingly, the potential of the node NM is retained.

In Period T2, instead of setting the potential of the wiring 116 to "H", the potential of the wiring 117 may be set to "–V" as indicated by the dashed line. When the potential of the wiring 117 is set to "–V", the transistor 102 can be turned off regardless of the potential of the node NS, and thus the potential of the node NM can be retained. Note that in Period T2, the potential of the wiring 116 may be set to "H" and the potential of the wiring 117 may be set to "–V".

When the potential of the wiring 118 is set to "H" in Period T3, the transistor 106 is turned on, and the potential retained in the node NM can be read to the wiring 119. By repeating the above operation, a signal sensed by the sensor element 101 in Period T1 can be read periodically. Furthermore, Period T1 can be made longer, and the maximum value during the period can be read.

Application Example 1

Figure 8A:
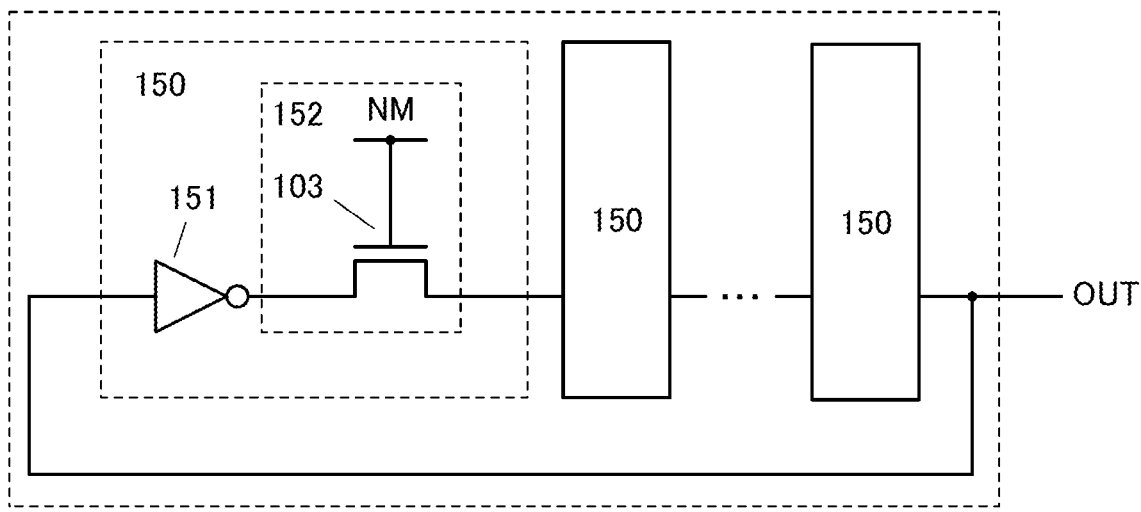
FIGS. 8A-8C Diagrams showing an oscillator and a counter circuit.

FIG. 8(A) is a diagram illustrating an oscillator 200 including, as one component, the semiconductor device of one embodiment of the present invention. The oscillator 200 is a ring-oscillator-based oscillator including an odd number of circuit blocks 150 in which an input terminal in the first stage is electrically connected to an output terminal in the last stage. Note that the circuit block 150 may have one stage, and an input terminal and an output terminal of the circuit block 150 may be electrically connected to each other.

The circuit block 150 includes an inverter circuit 151 and a delay circuit 152. Here, the circuit configuration of the semiconductor device illustrated in FIG. 1 can be used for the delay circuit 152. The oscillator 200 can change the oscillation frequency in accordance with the potential retained in the node NM.

An input terminal of the delay circuit 152 is the one of the source and the drain of the transistor 103 and is electrically connected to an output terminal of the inverter circuit 151. An output terminal of the delay circuit 152 is the other of the source and the drain of the transistor 103 and also functions as the output terminal of the circuit block 150. An input terminal of the inverter circuit 151 functions as the input terminal of the circuit block 150.

Note that for the delay circuit 152, a configuration in which the transistor 106 is omitted from each of the semiconductor devices 100a to 100e described above can also be used. Note that in the configuration, the one of the source and the drain of the transistor 103 and the other of the source and the drain of the transistor 102 are not electrically connected to each other.

Alternatively, the delay circuit 152 may include the transistor 106. In the case where the operation of the oscillator 200 is temporarily stopped, the transistor 106 is turned off, whereby the potential of the input terminal of the inverter circuit 151 can be retained. Accordingly, in the case where the operation of the oscillator 200 is resumed, a clock signal can be output immediately.

Note that the inverter circuit can be composed of a single-polarity circuit using OS transistors. Alternatively, a transistor including silicon in its channel formation region (hereinafter, a Si transistor) may be used, and transistors having different polarities may be combined.

A clock signal output from the oscillator 200 can be used as a clock signal for controlling operation of an external circuit. With the use of the oscillator 200, an operation of a system can be controlled in accordance with the intensity of light, oscillation (sound), the temperature, or the like.

Figure 8B:
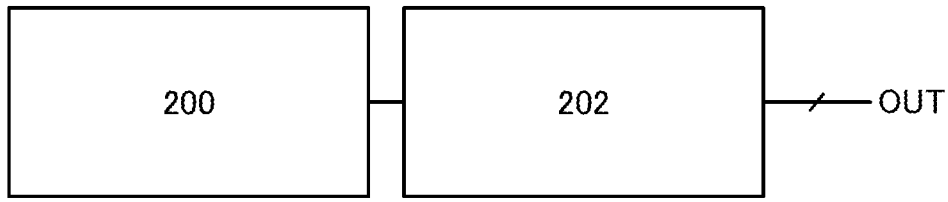

As illustrated in FIG. 8(B), a clock signal output from the oscillator 200 may be input to a counter circuit 202. The counter circuit 202 can output a multi-bit digital signal in response to the clock signal. Accordingly, the combination of the oscillator 200 and the counter circuit 202 can function as a digital sensor that quantifies the intensity of light, oscillation (sound), the temperature, or the like.

Figure 8C:
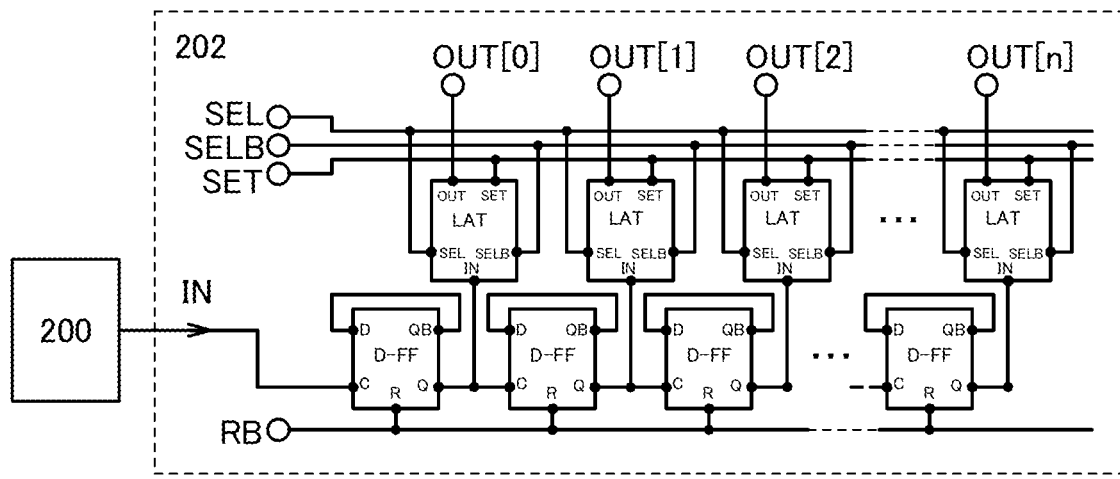

As the counter circuit 202, an n-bit (n is a natural number) counter circuit including D-FFs (D flip flops) shown in FIG. 8(C) can be used, for example. A clock signal output from the oscillator 200 is input to the D-FF in the first stage and is counted during a certain period. The counter circuit is reset by an RB signal and can start counting again. When a SET signal is input, the count value is transferred to a LAT circuit. When a SEL signal and a SELB signal are input, the value stored in the LAT circuit is output to a wiring OUT[0:n]. Note that the counter circuit is not limited to an asynchronous one but may be a synchronous one.

Application Example 2

Figure 9A:
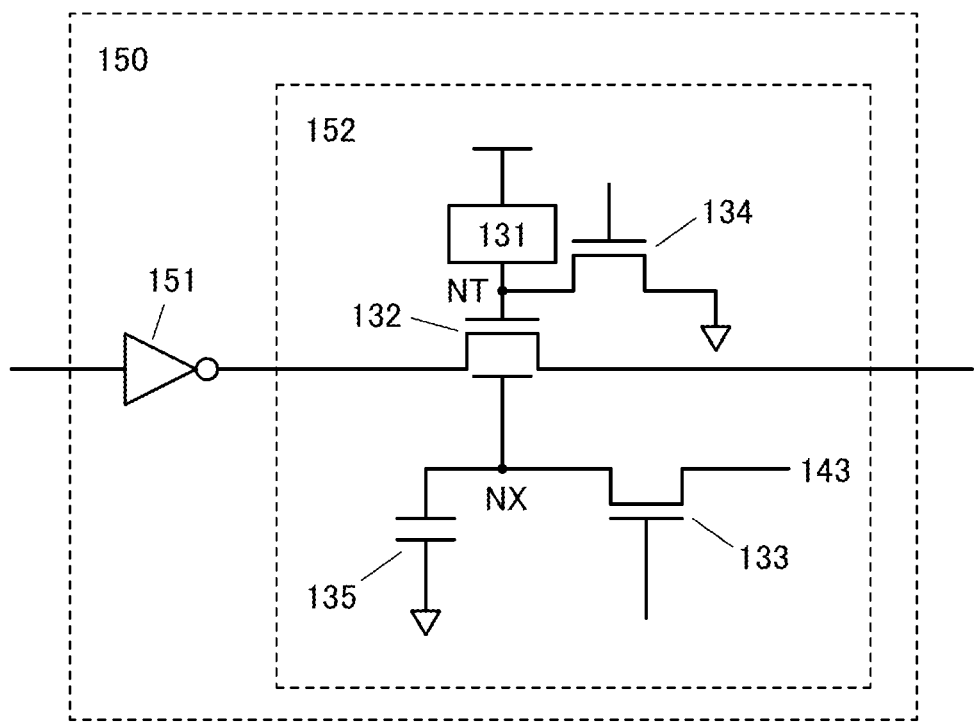
FIGS. 9A and 9B Diagrams showing an oscillator.

FIG. 9(A) is a diagram illustrating another configuration example of the circuit block 150 illustrated in FIG. 8(A). The delay circuit 152 includes a sensor element 131, transistors 132, 133, and 134, and a capacitor 135. As the sensor element 131, the same element as the sensor element 101 can be used. The transistor 132 includes a first gate and a second gate like the transistor 102.

The transistor 132 is desired to be operated at high speed, and the transistors 133 and 134 are desired to have a low off-state current. Accordingly, an OS transistor is preferably used as each of the transistors 132, 133, and 134.

The first gate of the transistor 132 is electrically connected to one electrode of the sensor element 131. One of a source and a drain of the transistor 134 is electrically connected to the first gate of the transistor 132. Here, a point at which the one electrode of the sensor element 131, the first gate of the transistor 132, and the one of the source and the drain of the transistor 134 are connected to each other is referred to as a node NT.

One of a source and a drain of the transistor 133 is electrically connected to the second gate of the transistor 132. One electrode of the capacitor 135 is electrically connected to the one of the source and the drain of the transistor 133. Here, a point at which the second gate of the transistor 132, the one of the source and the drain of the transistor 133, and the one electrode of the capacitor 135 are connected to each other is referred to as a node NX.

One of a source and a drain of the transistor 132 is electrically connected to the output terminal of the inverter circuit 151. The other of the source and the drain of the transistor 132 functions as the output terminal of the circuit block 150. The transistor 134 has a function of resetting the potential of the node NT.

When the transistor 133 is turned on, a predetermined potential signal is written from a wiring 143 to the node NX. The OS transistor has a low off-state current; therefore, the transistor 133 is turned off, whereby the potential of the node NX is retained for a long time. The transistor 132 is brought into a conduction state in response to the potential of the node NX, and the oscillator 200 generates a clock signal with a predetermined frequency. The clock signal can be used as a control signal of a main circuit, for example.

Here, when the potential of the node NT is changed by an operation of the sensor element 131, the threshold voltage of the transistor 132 is changed. The transistor 132 is in a conduction state by the potential written to the node NX, and the value of the output current is changed by a change in the threshold voltage. Accordingly, the frequency of a clock signal generated by the oscillator 200 is changed. Note that when the potential of the node NT can be largely changed by the sensor element 131, the transistor 132 can be turned off, and generation of a clock signal can be stopped.

For a specific example, the case of using, as the sensor element 131, the element whose capacitance is changed in accordance with the temperature and which is used in the semiconductor device 100e will be described. When a negative potential is applied to the other electrode of the sensor element 131, the potential of the node NT is changed to have a value smaller than the initial value with a rise in the temperature. Accordingly, the drain current of the transistor 132 is changed to have a smaller value, and thus, the frequency of the clock signal generated by the oscillator 200 becomes low.

In other words, the oscillator 200 generates a set clock signal in the initial operation but generates a clock signal having a lower frequency than that in the initial operation with a rise in the temperature. By using such characteristics, when the load of the circuit operation is large and the temperature rises, the clock frequency can be automatically reduced. For example, by using the oscillator 200 in a clock generator circuit such as LSI (a CPU, a GPU, an FPGA, an ASIC, or the like), breakdown or a reduction in lifetime of the element can be prevented.

Figure 9B:
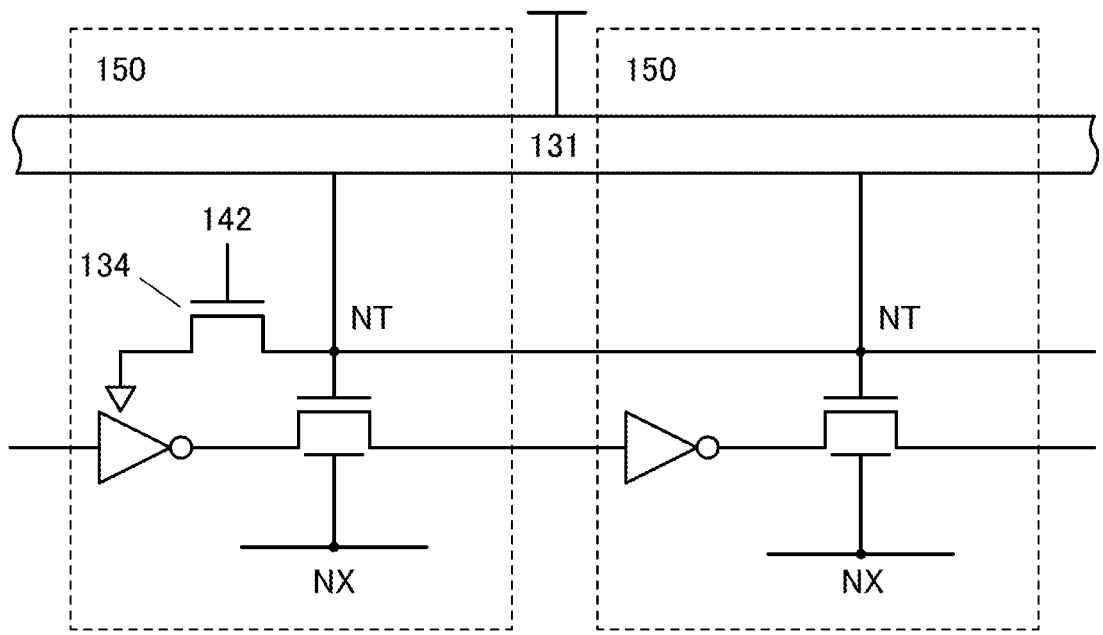

As illustrated in FIG. 9(B), the sensor element 131 may be shared by the plurality of circuit blocks 150. The transistor 134 may also be shared by the plurality of circuit block 150. Note that also in the oscillator 200 illustrated in FIG. 8(A), the sensor element 101 may be shared by the plurality of circuit blocks 150. The transistor for resetting the potential of the node NS may also be shared by the plurality of circuit blocks 150.

Application Example 3

Figure 10A:
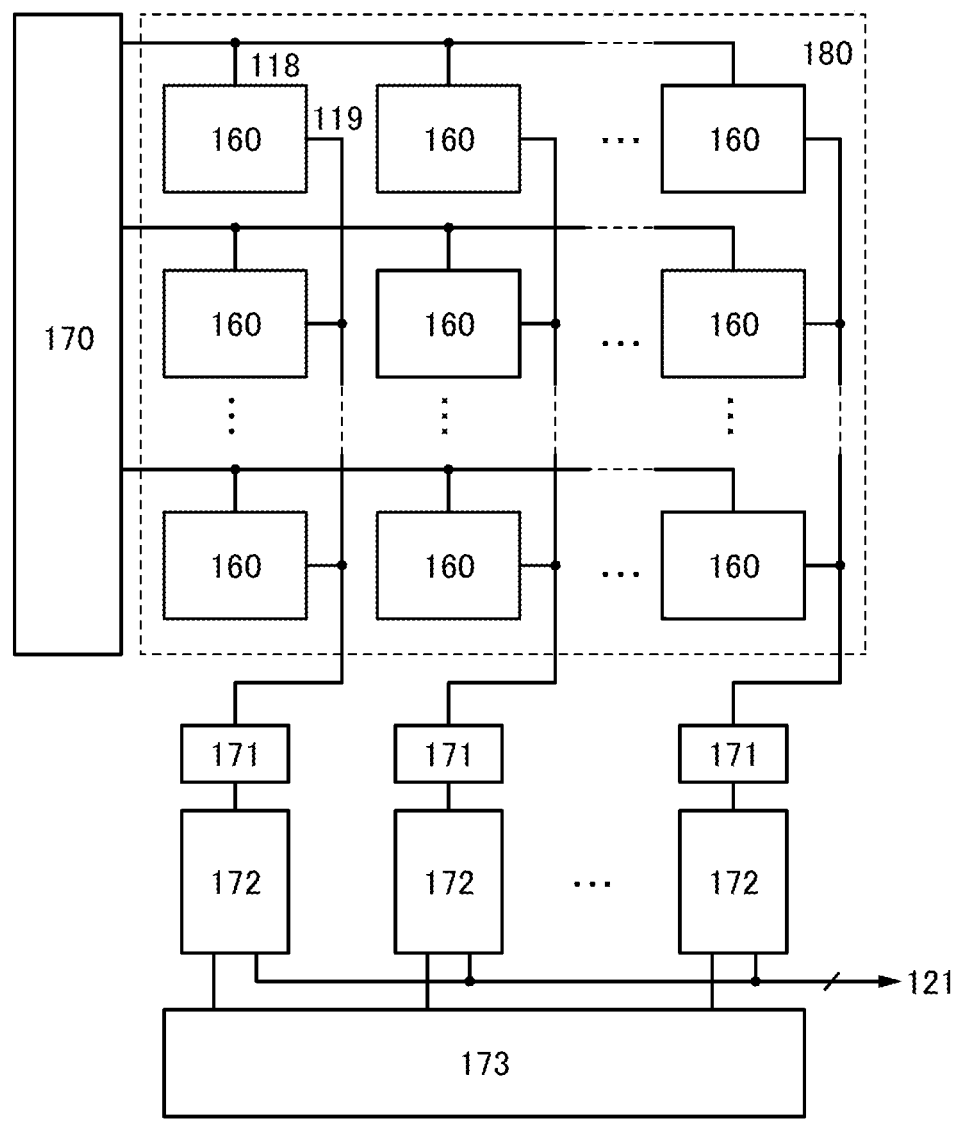
FIGS. 10A and 10B A block diagram and a circuit diagram showing a semiconductor device.

FIG. 10(A) is a block diagram illustrating a sensor device including the plurality of semiconductor devices of one embodiment of the present invention. The sensor device includes a sensor array 180, a circuit 170, circuits 171, circuits 172, and a circuit 173. The sensor array 180 includes circuits 160 arranged in a matrix.

Figure 10B:
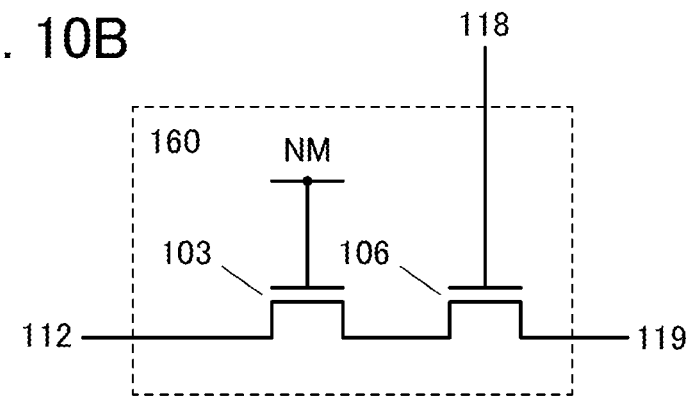

The circuits 160 can each have a circuit configuration of a semiconductor device illustrated in FIG. 10(B), for example. Alternatively, the circuit configuration of any of the semiconductor devices 100a to 100e described above may be used. The circuits 160 are electrically connected to the circuit 170 through the wirings 118. The circuits 160 are electrically connected to the circuits 171 through the wirings 119.

The circuit 170 can have a function of a row driver. As the circuit 170, for example, a decoder or a shift register can be used. A row from which reading is performed can be selected by the circuit 170, and signals generated in the circuits 160 can be output to the wirings 119.

The circuits 171 can have a function of reducing noise components from the signals output from the circuits 160. As the circuit 171, for example, a correlated double sampling circuit (CDS circuit) can be used. Note that the circuit 171 may be omitted.

The circuits 172 can have a function of a reading circuit. The circuits 172 can each include a comparator circuit and a counter circuit, for example. In the circuit 172, a signal potential that is input from the circuit 171 to the comparator circuit and a swept reference potential are compared. The counter circuit is operated in accordance with the output of the comparator circuit and generates a digital signal. In other words, the circuit 172 can function as an A/D converter.

The circuit 173 can have a function of a column driver. As the circuit 173, for example, a decoder or a shift register can be used. A column from which reading is performed is selected by the circuit 173, and digital data generated in the circuits 172 can be output to the wiring 121.

With the above configuration, signals obtained by the sensor elements 101 can be obtained from the circuits 160 arranged in a matrix. For example, when a photoelectric conversion element is used as the sensor element 101, the sensor element 101 can function as an image sensor. When a piezoelectric element is used, the sensor element 101 can function as a sheet-like pressure sensor, and data on in-plane distribution of pressure or the like can be obtained. When a heat sensitive element is used, the sensor element 101 can function as a sheet-like temperature sensor, and data of in-plane distribution of temperature or the like can be obtained. Moreover, the sensor element 101 can also function as an infrared image sensor.

Note that the connection destination of the wiring 121 is not limited. For example, a neural network, a memory device, a display device, a communication device, or the like can be a connection destination.

When the digital data output from the circuit 172 is taken into a neural network, for example, the obtained data can be subjected to processing such as an increase in resolution, a reduction in noise, recognition of a factor in changing the state of the sensor, data correction, character recognition, fingerprint authentication, failure analysis, or statistical processing.

This embodiment can be combined with the description of the other embodiments as appropriate.

Embodiment 2

In this embodiment, a configuration example of the semiconductor device which can be used in a neural network that can be used for the application examples described in Embodiment 1 will be described.

Figure 11A:
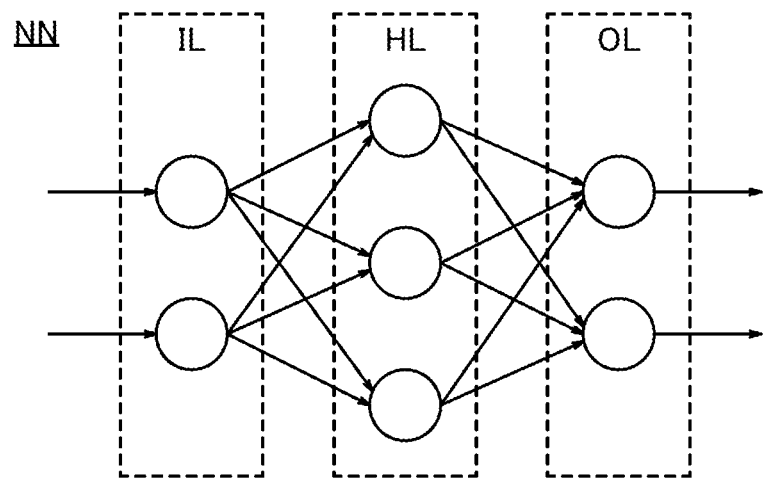
FIGS. 11A and 11B Diagrams showing a configuration example of a neural network.

As shown in FIG. 11(A), a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as DNN (a deep neural network), and learning using a deep neural network can also be referred to as deep learning.

Input data are input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 11B:
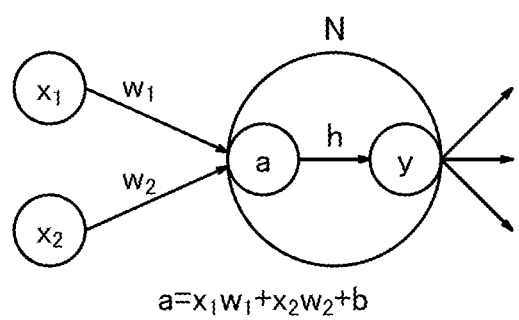

FIG. 11(B) shows an example of an operation with the neurons. Here, a neuron N and two neurons in the previous layer which output signals to the neuron N are shown. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal $y=h(a)$ is output from the neuron N.

In this manner, the operation with the neurons includes the operation that sums the products of the outputs and the weights of the neurons in the previous layer, that is, the product-sum operation ($x_1w_1+x_2w_2$ described above). This product-sum operation may be performed using a program on software or using hardware. In the case where the product-sum operation is performed by hardware, a product-sum arithmetic circuit can be used. Either a digital circuit or an analog circuit can be used as this product-sum arithmetic circuit.

An analog circuit is used as the product-sum arithmetic circuit of one embodiment of the present invention. Thus, the circuit scale of the product-sum arithmetic circuit can be reduced, or higher processing speed and lower power consumption can be achieved by reduced frequency of access to a memory.

The product-sum arithmetic circuit may be formed using a Si transistor or an OS transistor. An OS transistor is particularly preferably used as a transistor included in an analog memory of the product-sum arithmetic circuit because of its extremely low off-state current. Note that the product-sum arithmetic circuit may include both a Si transistor and an OS transistor. A configuration example of a semiconductor device serving as the product-sum arithmetic circuit will be described below.

<Configuration Example of Semiconductor Device>

Figure 12:
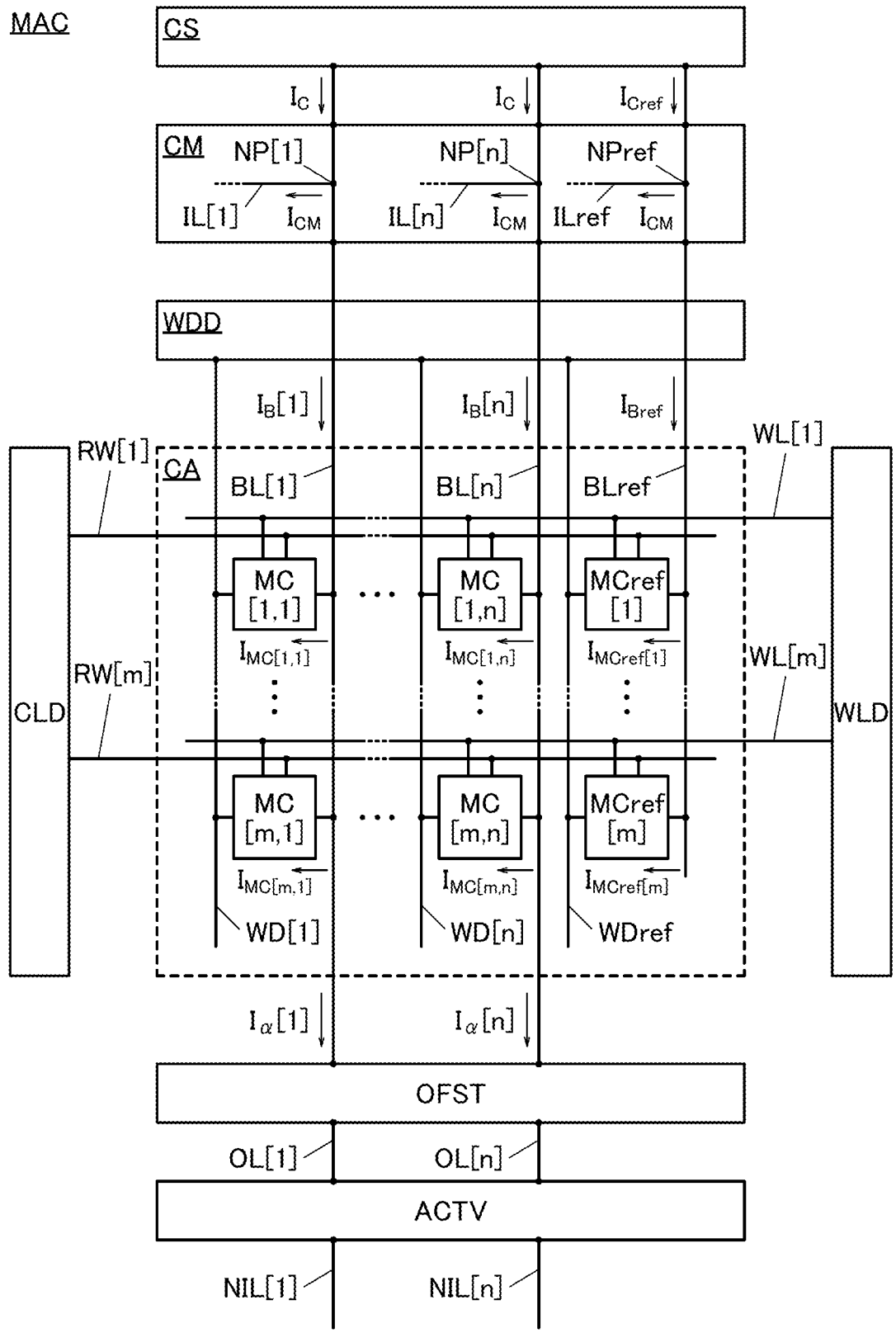
FIG. 12 A diagram showing a configuration example of a semiconductor device.

FIG. 12 illustrates a configuration example of a semiconductor device MAC configured to perform an operation of a neural network. The semiconductor device MAC is configured to perform a product-sum operation of first data corresponding to the connection strength (weight) between the neurons and second data corresponding to input data. Note that the first data and the second data can each be analog data or multilevel data (discrete data). The semiconductor device MAC is also configured to convert data obtained by the product-sum operation with the activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. In the configuration example shown in FIG. 12, the cell array CA includes the memory cells MC in m rows and n columns (memory cells MC[1, 1] to MC[m, n]) and the m memory cells MCref (memory cells MCref[1] to MCref[m]) (m and n are integers greater than or equal to 1). The memory cells MC are configured to store the first data. In addition, the memory cells MCref are configured to store reference data used for the product-sum operation. Note that the reference data can be analog data or multilevel data.

The memory cell MC[i,j] is connected to a wiring WL[i], a wiring RW[i], a wiring WD[j], and a wiring BL[j] (i is an integer greater than or equal to 1 and less than or equal to m, and j is an integer greater than or equal to 1 and less than or equal to n). In addition, the memory cell MCref[i] is connected to the wiring WL[i], the wiring RW[i], a wiring WDref, and a wiring BLref. Here, a current flowing between the memory cell MC[i,j] and the wiring BL[j] is denoted by $I_{C[i, j]}$, and a current flowing between the memory cell MCref[i] and the wiring BLref is denoted by $I_{MCref[i]}$.

Figure 13:
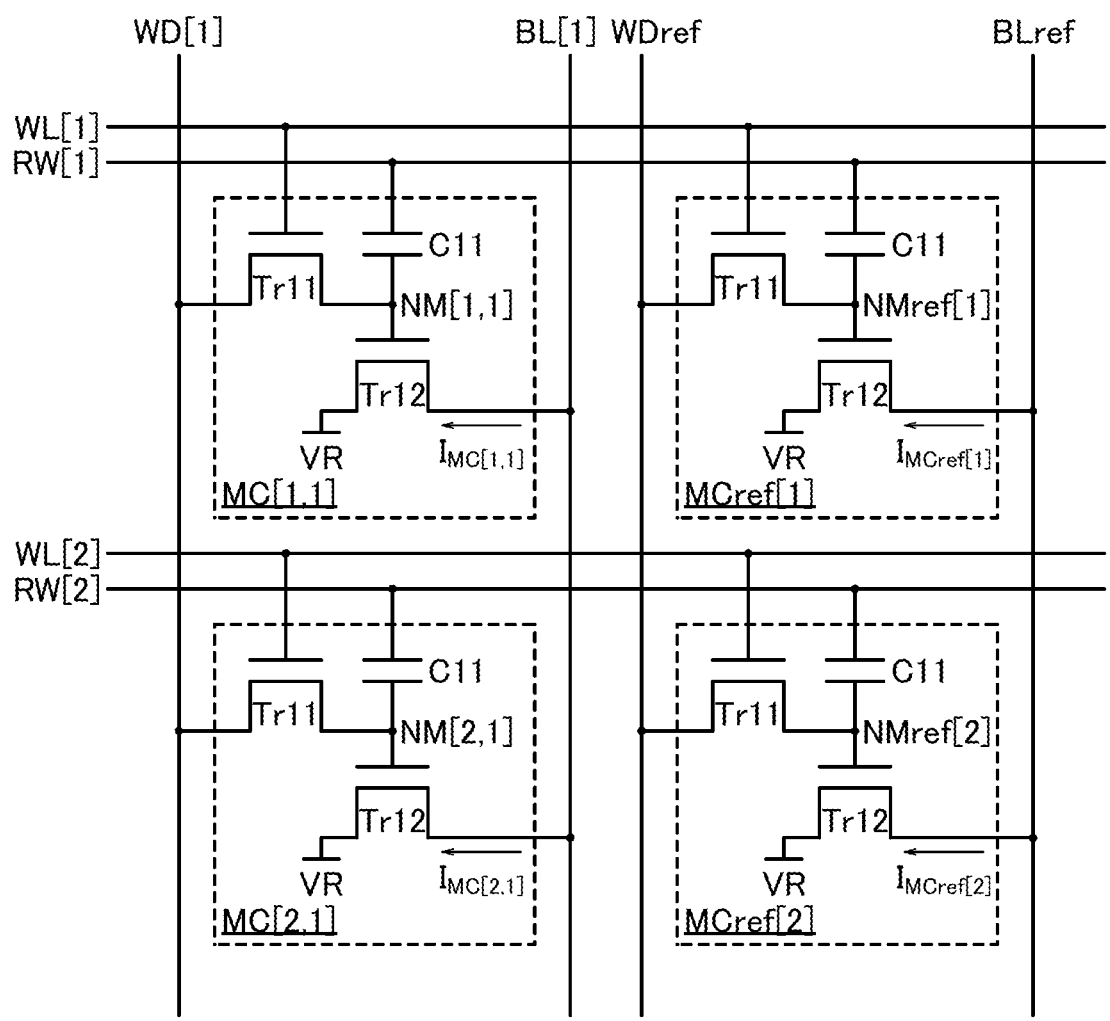
FIG. 13 A diagram showing a configuration example of memory cells.

FIG. 13 shows a specific configuration example of the memory cells MC and the memory cells MCref. Although the memory cells MC[1, 1] and MC[2, 1] and the memory cells MCref[1] and MCref[2] are given as typical examples in FIG. 13, similar configurations can also be used for other memory cells MC and other memory cells MCref. The memory cells MC and the memory cells MCref each include a transistor Tr11, a transistor Tr12, and a capacitor C11. Here, the case where the transistors Tr11 and Tr12 are n-channel transistors will be described.

In the memory cell MC, a gate of the transistor Tr11 is connected to the wiring WL, one of a source and a drain of the transistor Tr11 is connected to a gate of the transistor Tr12 and a first electrode of the capacitor C11, and the other of the source and the drain of the transistor Tr11 is connected to the wiring WD. One of a source and a drain of the transistor Tr12 is connected to the wiring BL, and the other of the source and the drain of the transistor Tr12 is connected to a wiring VR. A second electrode of the capacitor C11 is connected to the wiring RW. The wiring VR is configured to supply a predetermined potential. Here, the case where a low power supply potential (e.g., a ground potential) is supplied from the wiring VR is described as an example.

Anode connected to the one of the source and the drain of the transistor Tr11, the gate of the transistor Tr12, and the first electrode of the capacitor C11 is referred to as a node NM. The nodes NM included in the memory cells MC[1, 1] and MC[2, 1] are referred to as nodes NM[1, 1] and NM[2, 1], respectively.

The memory cells MCref have a configuration similar to that of the memory cell MC. However, the memory cells MCref are connected to the wiring WDref instead of the wiring WD and connected to a wiring BLref instead of the wiring BL. Each of a node NMref[1] in the memory cell MCref[1] and a node NMref[2] in the memory cell MCref[2] refers to a node connected to the one of the source and the drain of the transistor Tr11, the gate of the transistor Tr12, and the first electrode of the capacitor C11.

The node NM and the node NMref function as retaining nodes of the memory cell MC and the memory cell MCref, respectively. The first data is retained in the node NM and the reference data is retained in the node NMref. Currents $I_{MC[1, 1]}$ and $I_{MC[2, 1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 is configured to retain the potential of the node NM or the node NMref, the off-state current of the transistor Tr11 is preferably low. Thus, it is preferable to use an OS transistor, which has an extremely low off-state current, as the transistor Tr11. This suppresses a change in the potential of the node NM or the node NMref, so that the operation accuracy can be increased. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wiring BL[1] to the wiring BL[n] and the wiring BLref. The current source circuit CS is configured to supply currents to the wiring BL[1] to the wiring BL[n] and the wiring BLref. Note that the value of the current supplied to the wiring BL[1] to the wiring BL[n] may be different from the value of the current supplied to the wiring BLref. Here, the current supplied from the current source circuit CS to the wiring BL[1] to the wiring BL[n] is denoted by $I_C$, and the current supplied from the current source circuit CS to the wiring BLref is denoted by $I_{Cref}$.

The current mirror circuit CM includes a wiring IL[1] to a wiring IL[n] and a wiring ILref. The wiring IL[1] to the wiring IL[n] are connected to the wiring BL[1] to the wiring BL[n], respectively, and the wiring ILref is connected to the wiring BLref. Here, a connection portion between the wiring IL[1] and the wiring BL[1] to a connection portion between the wiring IL[n] and the wiring BL[n] are referred to as a node NP[1] to a node NP[n], respectively. Furthermore, a connection portion between the wiring ILref and the wiring BLref is referred to as a node NPref.

The current mirror circuit CM is configured to supply a current $I_{CM}$ corresponding to the potential of the node NPref to the wiring ILref and supply this current $I_{CM}$ also to the wiring IL[1] to the wiring IL[n]. In the example shown in FIG. 12, the current $I_{CM}$ is discharged from the wiring BLref to the wiring ILref, and the current $I_{CM}$ is discharged from the wiring BL[1] to the wiring BL[n] to the wiring IL[1] to the wiring IL[n]. Furthermore, currents flowing from the current mirror circuit CM to the cell array CA through the wiring BL[1] to the wiring BL[n] are denoted by $I_B[1]$ to $I_B[n]$, respectively. Furthermore, a current flowing from the current mirror circuit CM to the cell array CA through the wiring BLref is denoted by $I_{Bref}$.

The circuit WDD is connected to the wiring WD[1] to the wiring WD[n] and the wiring WDref. The circuit WDD is configured to supply a potential corresponding to the first data stored in the memory cells MC to the wiring WD[1] to the wiring WD[n]. The circuit WDD is also configured to supply a potential corresponding to the reference data stored in the memory cell MCref to the wiring WDref. The circuit WLD is connected to wiring WL[1] to the wiring WL[m]. The circuit WLD is configured to supply a signal for selecting the memory cell MC or MCref to which data is to be written, to any of the wiring WL[1] to the wiring WL[m]. The circuit CLD is connected to the wirings RW[1] to RW[m]. The circuit CLD is configured to supply a potential corresponding to the second data to the wiring RW[1] to the wiring RW[m].

The offset circuit OFST is connected to the wiring BL[1] to the wiring BL[n] and a wiring OL[1] to a wiring OL[n]. The offset circuit OFST is configured to determine the amount of currents flowing from the wiring BL[1] to the wiring BL[n] to the offset circuit OFST and/or the amount of change in the currents flowing from the wiring BL[1] to the wiring BL[n] to the offset circuit OFST. The offset circuit OFST is also configured to output determination results to the wiring OL[1] to the wiring OL[n]. Note that the offset circuit OFST may output currents corresponding to the determination results to the wirings OL, or may convert the currents corresponding to the determination results into voltages to output the voltages to the wirings OL. The currents flowing between the cell array CA and the offset circuit OFST are denoted by $I_\alpha[1]$ to $I_\alpha[n]$.

Figure 14:
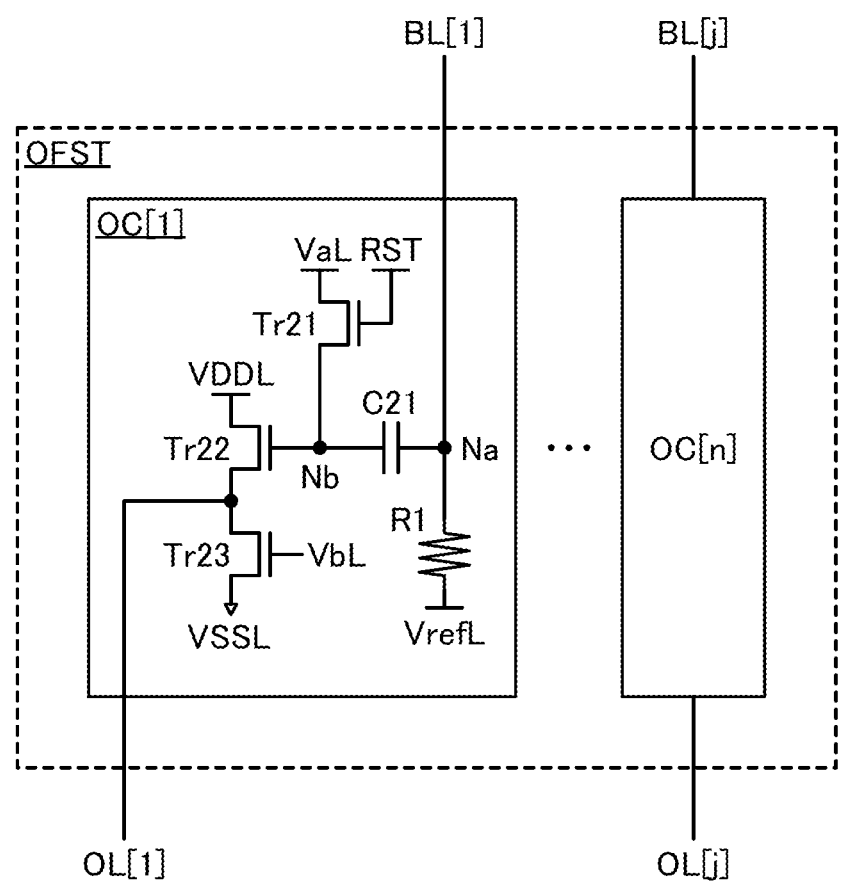
FIG. 14 A diagram showing a configuration example of an offset circuit.

FIG. 14 shows a configuration example of the offset circuit OFST. The offset circuit OFST shown in FIG. 14 includes a circuit OC[1] to a circuit OC[n]. The circuit OC[1] to the circuit OC[n] each include a transistor Tr21, a transistor Tr22, a transistor Tr23, a capacitor C21, and a resistor R1. Connection relations of the elements are shown in FIG. 14. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL is configured to supply a potential Vref, a wiring VaL is configured to supply a potential Va, and a wiring VbL is configured to supply a potential Vb. Furthermore, a wiring VDDL is configured to supply a potential VDD, and a wiring VSSL is configured to supply a potential VSS. Here, the case where the potential VDD is a high power supply potential and the potential VSS is a low power supply potential is described. A wiring RST is configured to supply a potential for controlling the on/off state of the transistor Tr21. The transistor Tr22, the transistor Tr23, the wiring VDDL, the wiring VSSL, and the wiring VbL form a source follower circuit.

Next, an operation example of the circuit OC[1] to the circuit OC[n] will be described. Note that although an operation example of the circuit OC[1] is described here as a typical example, the circuit OC[2] to the circuit OC[n] can be operated in a manner similar to that of the circuit OC[1]. First, when a first current flows to the wiring BL[1], the potential of the node Na becomes a potential corresponding to the first current and the resistance value of the resistor R1. At this time, the transistor Tr21 is on, and thus the potential Va is supplied to the node Nb. Then, the transistor Tr21 is turned off.

Next, when a second current flows to the wiring BL[1], the potential of the node Na becomes a potential corresponding to the second current and the resistance value of the resistor R1. At this time, since the transistor Tr21 is off and the node Nb is in a floating state, the potential of the node Nb is changed owing to capacitive coupling, following the change in the potential of the node Na. Here, when the amount of change in the potential of the node Na is $\Delta V_{Na}$ and the capacitive coupling coefficient is 1, the potential of the node Nb is $Va + \Delta V_{Na}$. In addition, when the threshold voltage of the transistor Tr22 is Vth, a potential of $Va + \Delta V_{Na} - V_{th}$ is output from the wiring OL[1]. Here, when $Va = V_{th}$, the potential $\Delta V_{Na}$ can be output from the wiring OL[1].

The potential $\Delta V_{Na}$ is determined by the amount of change from the first current to the second current, the resistor R1, and the potential Vref. Here, since the resistor R1 and the potential Vref are known, the amount of change in the current flowing to the wiring BL can be found from the potential $\Delta V_{Na}$.

A signal corresponding to the amount of current and/or the amount of change in the current that are/is determined by the offset circuit OFST as described above is input to the activation function circuit ACTV through the wiring OL[1] to the wiring OL[n].

The activation function circuit ACTV is connected to the wiring OL[1] to the wiring OL[n] and a wiring NIL[1] to a wiring NIL[n]. The activation function circuit ACTV is configured to perform an operation for converting the signal input from the offset circuit OFST in accordance with the predefined activation function. As the activation function, for example, a sigmoid function, a tanh function, a softmax function, a ReLU function, a threshold function, or the like can be used. The signal converted by the activation function circuit ACTV is output as output data to the wiring NIL[1] to the wiring NIL[n].

<Operation Example of Semiconductor Device>

With the above semiconductor device MAC, the product-sum operation of the first data and the second data can be performed. An operation example of the semiconductor device MAC at the time of performing the product-sum operation will be described below.

Figure 15:
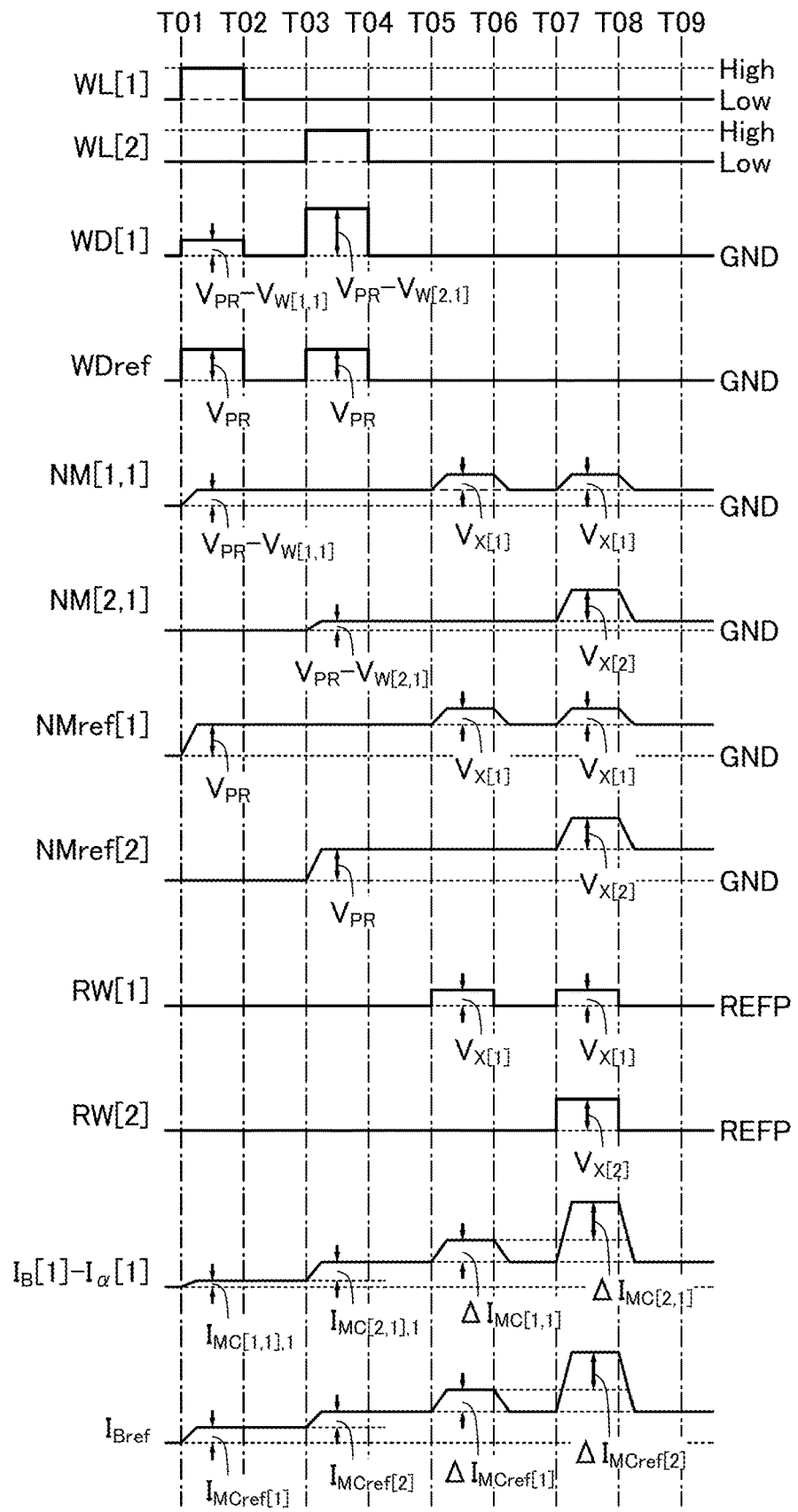
FIG. 15 A timing chart showing an operation of a semiconductor device.

FIG. 15 shows a timing chart of the operation example of the semiconductor device MAC. FIG. 15 shows changes in the potentials of the wirings WL[1], WL[2], WD[1], and WDref, the nodes NM[1, 1], NM[2, 1], NMref[1], and NMref[2], and the wirings RW[1] and RW[2] in FIG. 13 and changes in the values of the currents $I_B[1]-I_\alpha[1]$ and $I_{Bref}$. The current $I_B[1]-I_\alpha[1]$ corresponds to the sum total of the currents flowing from the wiring BL[1] to the memory cells MC[1, 1] and MC[2, 1].

Although an operation of the memory cells MC[1, 1], MC[2, 1], MCref[1], and MCref[2] shown in FIG. 13 is described as a typical example, the other memory cells MC and MCref can also be operated in a similar manner.

[Storage of First Data]

First, during a period from Time T01 to Time T02, the potential of the wiring WL[1] becomes a high level (High), the potential of the wiring WD[1] becomes a potential greater than a ground potential (GND) by $V_{PR}-V_{W[1, 1]}$, and the potential of the wiring WDref becomes a potential greater than the ground potential by $V_{PR}$. The potentials of the wirings RW[1] and RW[2] are reference potentials (REFP). Note that the potential $V_{W[1, 1]}$, is the potential corresponding to the first data stored in the memory cell MC[1, 1]. The potential $V_{PR}$ is the potential corresponding to the reference data. Thus, the transistors Tr11 included in the memory cells MC[1, 1] and MCref[1] are turned on, and the potential of the node NM[1, 1] becomes $V_{PR}-V_{W[1, 1]}$, and the potential of the node NMref[1] becomes $V_{PR}$.

In this case, a current $I_{MC[1, 1], 0}$ flowing from the wiring BL[1] to the transistor Tr12 in the memory cell MC[1, 1] can be expressed by a formula shown below. Here, k is a constant determined by the channel length, the channel width, the mobility, the capacitance of a gate insulating film, and the like of the transistor Tr12. In addition, $V_{th}$ is the threshold voltage of the transistor Tr12.

$$I_{MC[1,1],0}=k(V_{PR}-V_{W[1,1]}-V_{th})^2 \quad (E1)$$

A current $I_{MCref[1], 0}$ flowing from the wiring BLref to the transistor Tr12 in the memory cell MCref[1] can be expressed by a formula shown below.

$$I_{MCref[1],0}=k(V_{PR}-V_{th})^2 \quad (E2)$$

Next, from Time T02 to T03, the potential of the wiring WL[1] becomes a low level (Low). Consequently, the transistors Tr11 included in the memory cells MC[1, 1] and MCref[1] are turned off, and the potentials of the nodes NM[1, 1] and NMref[1] are retained.

As described above, an OS transistor is preferably used as the transistor Tr11. This can suppress the leakage current of the transistor Tr11, so that the potentials of the nodes NM[1, 1] and NMref[1] can be accurately retained.

Next, from Time T03 to T04, the potential of the wiring WL[2] becomes a high level (High), the potential of the wiring WD[1] becomes a potential greater than the ground potential by $V_{PR}-V_{W[2, 1]}$, and the potential of the wiring WDref becomes a potential greater than the ground potential by $V_{PR}$. Note that the potential $V_{W[2, 1]}$ is a potential corresponding to the first data stored in the memory cell MC[2, 1]. Thus, the transistors Tr11 included in the memory cells MC[2, 1] and MCref[2] are turned on, and the potential of the node NM[2, 1] becomes $V_{PR}-V_{W[2, 1]}$ and the potential of the node NMref[2] becomes $V_{PR}$.

Here, a current $I_{MC[2, 1], 0}$ flowing from the wiring BL[1] to the transistor Tr12 in the memory cell MC[2, 1] can be expressed by a formula shown below.

$$I_{MC[2,1],0}=k(V_{PR}-V_{W[2,1]}-V_{th})^2 \quad (E3)$$

Furthermore, a current $I_{MCref[2], 0}$ flowing from the wiring BLref to the transistor Tr12 in the memory cell MCref[2] can be expressed by a formula shown below.

$$I_{MCref[2],0}=k(V_{PR}-V_{th})^2 \quad (E4)$$

Next, from Time T04 to T05, the potential of the wiring WL[2] becomes a low level (Low). Consequently, the transistors Tr11 included in the memory cells MC[2, 1] and MCref[2] are turned off, and the potentials of the nodes NM[2, 1] and NMref[2] are retained.

Through the above operation, the first data is stored in the memory cells MC[1, 1] and MC[2, 1], and the reference data is stored in the memory cells MCref[1] and MCref[2].

Here, currents flowing to the wirings BL[1] and BLref from Time T04 to T05 are considered. The current is supplied from the current source circuit CS to the wiring BLref. The current flowing through the wiring BLref is discharged to the current mirror circuit CM and the memory cells MCref[1] and MCref[2]. A formula shown below holds, where $I_{Cref}$ is the current supplied from the current source circuit CS to the wiring BLref and $I_{CM, 0}$ is the current discharged from the wiring BLref to the current mirror circuit CM.

$$I_{Cref}-I_{CM,0}=I_{MCref[1],0}+I_{MCref[2],0} \quad (E5)$$

The current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{C, 0}$ is the current supplied from the current source circuit CS to the wiring BL[1] and $I_{\alpha, 0}$ is the current flowing from the wiring BL[1] to the offset circuit OFST.

$$I_C-I_{CM,0}=I_{MC[1,1],0}+I_{MC[2,1],0}+I_{\alpha,0} \quad (E6)$$

[Product-Sum Operation of First Data and Second Data]

Next, from Time T05 to T06, the potential of the wiring RW[1] becomes a potential greater than the reference potential by $V_{X[1]}$. At this time, the potential $V_{X[1]}$ is supplied to the capacitors C11 in the memory cells MC[1, 1] and MCref[1], so that the potentials of the gates of the transistors Tr12 increase owing to capacitive coupling. Note that the potential $V_{X[1]}$ is the potential corresponding to the second data supplied to the memory cells MC[1, 1] and MCref[1].

The amount of change in the potential of the gate of the transistor Tr12 corresponds to the value obtained by multiplying the amount of change in the potential of the wiring RW by a capacitive coupling coefficient determined by the memory cell configuration. The capacitive coupling coefficient is calculated on the basis of the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is set to 1. In practice, the potential $V_x$ can be determined in consideration of the capacitive coupling coefficient.

When the potential $V_{X[1]}$ is supplied to the capacitors C11 in the memory cell MC[1,1] and the memory cell MCref[1], the potentials of the node NM[1,1] and the node NMref[1] each increase by $V_{X[1]}$.

Here, a current $I_{MC[1, 1], 1}$ flowing from the wiring BL[1] to the transistor Tr12 in the memory cell MC[1, 1] from Time T05 to T06 can be expressed by a formula shown below.

$$I_{MC[1,1],1}=k(V_{PR}-V_{W[1,1]}+V_{X[1]}-V_{th})^2 \quad (E7)$$

Thus, when the potential $V_{X[1]}$ is supplied to the wiring RW[1], the current flowing from the wiring BL[1] to the transistor Tr12 in the memory cell MC[1, 1] increases by $\Delta I_{MC[1, 1]} = I_{MC[1, 1], 1} - I_{MC[1, 1], 0}$.

Here, a current $I_{MCref[1], 1}$ flowing from the wiring BLref to the transistor Tr12 in the memory cell MCref[1] during the period from Time T05 to Time T06 can be expressed by a formula shown below.

$$I_{MCref[1],1} = k(V_{PR} + V_{X[1]} - V_{th})^2 \tag{E8}$$

Thus, when the potential $V_{X[1]}$ is supplied to the wiring RW[1], the current flowing from the wiring BLref to the transistor Tr12 in the memory cell MCref[1] increases by $\Delta I_{MCref[1]} = I_{MCref[1], 1} - I_{MCref[1], 0}$.

Furthermore, currents flowing to the wirings BL[1] and BLref are considered. A current $I_{Cref}$ is supplied from the current source circuit CS to the wiring BLref. The current flowing through the wiring BLref is discharged to the current mirror circuit CM and the memory cells MCref[1] and MCref[2]. A formula shown below holds, where $I_{CM, 1}$ is the current discharged from the wiring BLref to the current mirror circuit CM.

$$I_{Cref} - I_{CM,1} = I_{MCref[1],1} + I_{MCref[2],0} \tag{E9}$$

The current $I_C$ is supplied from the current source circuit CS to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{\alpha, 1}$ is the current flowing from the wiring BL[1] to the offset circuit OFST.

$$I_C - I_{CM,1} = I_{MC[1,1],1} + I_{MC[2,1],1} + I_{\alpha,1} \tag{E10}$$

In addition, from Formulae (E1) to (E10), a difference between the current $I_{\alpha, 0}$ and the current $I_{\alpha, 1}$ (differential current $\Delta I_\alpha$) can be expressed by a formula shown below.

$$\Delta I_\alpha = I_{\alpha,0} - I_{\alpha,1} = 2kV_{W[1,1]}V_{X[1]} \tag{E11}$$

Thus, the differential current $\Delta I_\alpha$ is a value corresponding to the product of the potentials $V_{W[1, 1]}$ and $V_{X[1]}$.

After that, during a period from Time T06 to Time T07, the potential of the wiring RW[1] becomes the ground potential, and the potentials of the nodes NM[1, 1] and NMref[1] become the same as the potentials thereof during the period from Time T04 to Time T05.

Next, during a period from Time T07 to Time T08, the potential of the wiring RW[1] becomes the potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitors C11 in the memory cells MC[1, 1] and MCref[1], and the potentials of the nodes NM[1, 1] and NMref[1] each increase by $V_{X[1]}$ owing to capacitive coupling. Furthermore, the potential $V_{X[2]}$ is supplied to the capacitors C11 in the memory cells MC[2, 1] and MCref[2], and the potentials of the nodes NM[2, 1] and NMref[2] each increase by $V_{X[2]}$ owing to capacitive coupling.

Here, the current $I_{MC[2, 1]}$ flowing from the wiring BL[1] to the transistor Tr12 in the memory cell MC[2, 1] during the period from Time T07 to Time T08 can be expressed by a formula shown below.

$$I_{MC[2,1],1} = k(V_{PR} - V_{W[2,1]} + V_{X[2]} - V_{th})^2 \tag{E12}$$

Thus, when the potential $V_{X[2]}$ is supplied to the wiring RW[2], the current flowing from the wiring BL[1] to the transistor Tr12 in the memory cell MC[2, 1] increases by $\Delta I_{MC[2, 1]} = I_{MC[2, 1], 1} - I_{MC[2, 1], 0}$.

Here, a current $I_{MCref[2], 1}$ flowing from the wiring BLref to the transistor Tr12 in the memory cell MCref[2] during the period from Time T07 to Time T08 can be expressed by a formula shown below.

$$I_{MCref[2],1} = k(V_{PR} + V_{X[2]} - V_{th})^2 \tag{E13}$$

Thus, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing to the wirings BL[1] and BLref are considered. The current $I_{Cref}$ is supplied from the current source circuit CS to the wiring BLref. The current flowing through the wiring BLref is discharged to the current mirror circuit CM and the memory cells MCref[1] and MCref[2]. A formula shown below holds, where $I_{CM, 2}$ is the current discharged from the wiring BLref to the current mirror circuit CM.

$$I_{Cref} - I_{CM,2} = I_{MCref[1],1} + I_{MCref[2],1} \tag{E14}$$

The current $I_C$ is supplied from the current source circuit CS to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds, where $I_{\alpha, 2}$ is the current flowing from the wiring BL[1] to the offset circuit OFST.

$$I_C - I_{CM,2} = I_{MC[1,1],1} + I_{MC[2,1],1} + I_{\alpha,2} \tag{E15}$$

In addition, from Formulae (E1) to (E8) and (E12) to (E15), a difference between the current $I_{\alpha, 0}$ and the current $I_{\alpha, 2}$ (differential current $\Delta I_\alpha$) can be expressed by a formula shown below.

$$\Delta I_\alpha = I_{\alpha,0} - I_{\alpha,2} = 2k(V_{W[1,1]}V_{X[1]} + V_{W[2,1]}V_{X[2]}) \tag{E16}$$

Thus, the differential current $\Delta I_\alpha$ is a value corresponding to the sum of the product of the potentials $V_{W[1, 1]}$ and $V_{X[1]}$ and the product of the potentials $V_{W[2, 1]}$ and $V_{X[2]}$.

After that, during a period from Time T08 to Time T09, the potentials of the wirings RW[1] and RW[2] become the ground potential, and the potentials of the nodes NM[1, 1], NM[2, 1], NMref[1], and NMref[2] become the same as the potentials thereof during the period from Time T04 to Time T05.

As represented by Formulae (E11) and (E16), the differential current $\Delta I_\alpha$ input to the offset circuit OFST is a value corresponding to the sum of the product of the potential $V_X$ corresponding to the first data (weight) and the potential $V_W$ corresponding to the second data (input data). Thus, measurement of the differential current $\Delta I_\alpha$ with the offset circuit OFST gives the result of the product-sum operation of the first data and the second data.

Note that although the memory cells MC[1, 1], MC[2, 1], MCref[1], and MCref[2] are focused on in the above description, the number of the memory cells MC and MCref can be any number. In the case where the number m of rows of the memory cells MC and MCref is a given number, the differential current $\Delta I_\alpha$ can be expressed by a formula shown below.

$$\Delta I_\alpha = 2k\Sigma_i V_{W[i,1]} V_{X[i]} \tag{E17}$$

When the number n of columns of the memory cells MC and MCref is increased, the number of product-sum operations executed in parallel can be increased.

The product-sum operation of the first data and the second data can be performed using the semiconductor device MAC as described above. Note that the use of the configuration of the memory cells MC and MCref in FIG. 13 allows the product-sum arithmetic circuit to be formed using fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 11(A) is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the configuration of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), and the like.

The product-sum operation of the neural network can be performed using the semiconductor device MAC as described above. Furthermore, when the memory cells MC and MCref shown in FIG. 13 are used for the cell array CA, it is possible to provide an integrated circuit $I_C$ with an improved operation accuracy, lower power consumption, or a reduced circuit scale.

This embodiment can be combined with any of the other embodiments as appropriate.

Embodiment 3

In this embodiment, a specific configuration and the like of the semiconductor device of one embodiment of the present invention will be described.

Figure 16A:
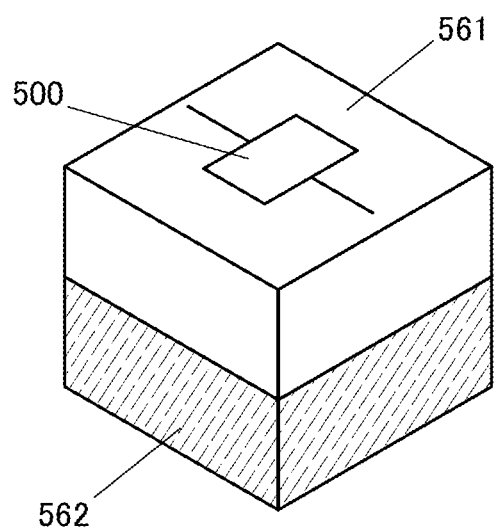
FIGS. 16A-16E Diagrams showing configurations of a semiconductor device.

FIG. 16(A) illustrates a configuration example of the semiconductor device of one embodiment of the present invention. The semiconductor device illustrated in FIG. 16(A) is an example having a stacked-layer structure of a layer 561 and a layer 562.

The layer 561 includes a sensor element 500. The sensor element 500 corresponds to the sensor element 101 or 131 described in Embodiment 1.

Figure 16B:
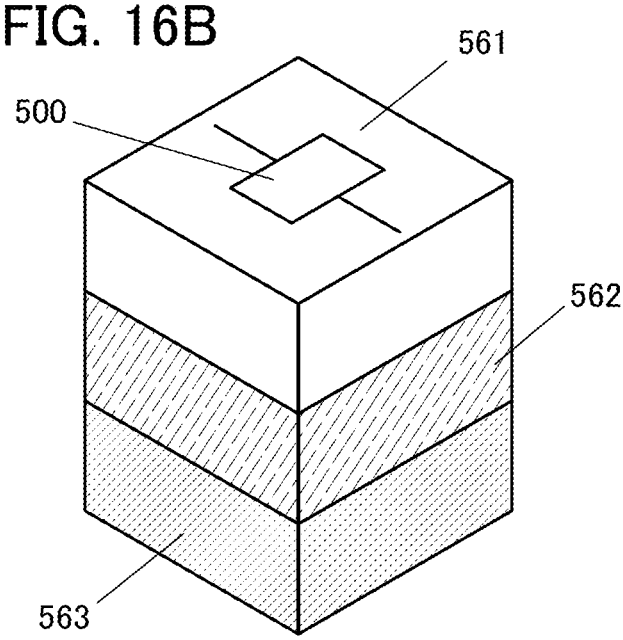
Figure 16C:
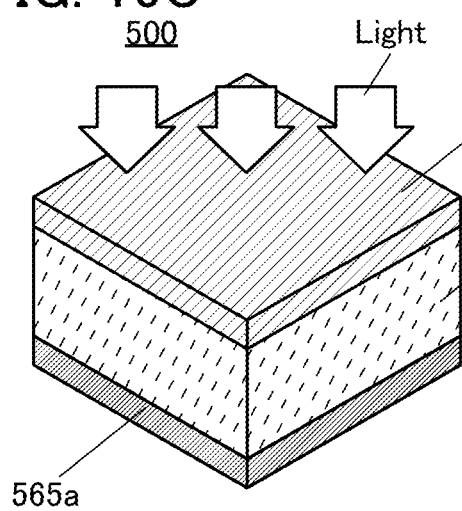
Figure 16D:
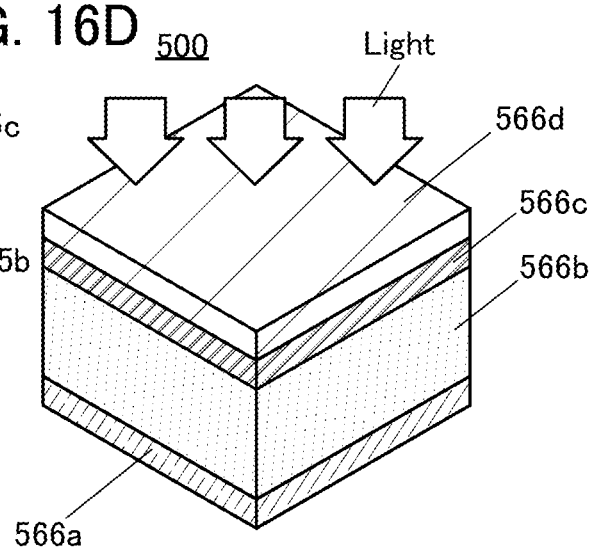

FIGS. 16(C) and 16(D) are diagrams illustrating photoelectric conversion elements that can be used as the sensor element 500. Each of the photoelectric conversion elements can be a stacked layer of a layer 565a, a layer 565b, and a layer 565c as illustrated in FIG. 16(C).

The sensor element 500 illustrated in FIG. 16(C) is a pn-junction photodiode; for example, a $p^+$-type semiconductor, an n-type semiconductor, and an $n^+$-type semiconductor can be used for the layer 565a, the layer 565b, and the layer 565c, respectively. Alternatively, an $n^+$-type semiconductor, a p-type semiconductor, and a $p^+$-type semiconductor may be used for the layer 565a, the layer 565b, and the layer 565c, respectively. Alternatively, a pin-junction photodiode in which the layer 565b is an i-type semiconductor may be used.

The above-described pn-junction photodiode or pin-junction photodiode can be formed using single crystal silicon. Furthermore, the pin-junction photodiode can also be formed using a thin film of amorphous silicon, microcrystalline silicon, polycrystalline silicon, or the like.

The sensor element 500 included in the layer 561 may be a stacked layer of a layer 566a, a layer 566b, a layer 566c, and a layer 566d as illustrated in FIG. 16(D). The sensor element 500 illustrated in FIG. 16(D) is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

As the layer 566d, a conductive layer having a high visible light-transmitting property is preferably used. For example, indium oxide, tin oxide, zinc oxide, indium tin oxide, gallium zinc oxide, indium gallium zinc oxide, graphene, or the like can be used. Note that the layer 566d can be omitted.

The layers 566b and 566c of the photoelectric conversion portion can have, for example, a structure of a pn-junction photodiode with a selenium-based material for a photoelectric conversion layer. A selenium-based material, which is a p-type semiconductor, is preferably used for the layer 566b, and gallium oxide or the like, which is an n-type semiconductor, is preferably used for the layer 566c.

The photoelectric conversion element with a selenium-based material has a property of high external quantum efficiency with respect to visible light. In the photoelectric conversion element, the amount of amplification of carriers with respect to the amount of incident light can be increased by utilizing the avalanche multiplication. A selenium-based material has a high light-absorption coefficient, and thus has advantages in production; for example, a photoelectric conversion layer can be fabricated as a thin film. A thin film of a selenium-based material can be formed by a vacuum evaporation method, a sputtering method, or the like.

As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed with a material having a wide band gap and a visible light-transmitting property. For example, zinc oxide, gallium oxide, indium oxide, tin oxide, or a mixed oxide thereof can be used. In addition, these materials also have a function of a hole injection blocking layer, and a dark current can be decreased.

Figure 16E:
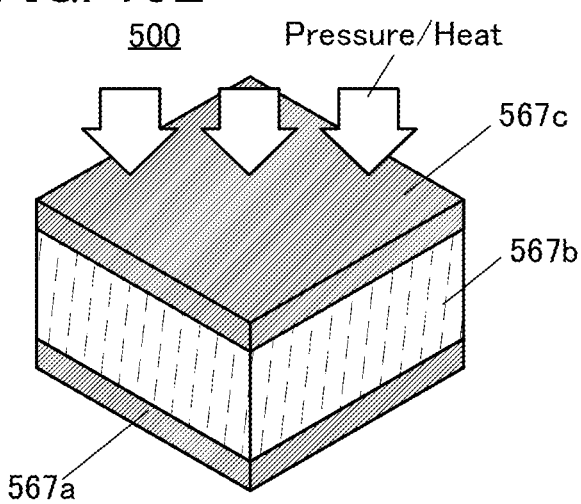

FIG. 16(E) is a diagram illustrating a piezoelectric element (heat sensitive element) that can be used as the sensor element 500. The piezoelectric element can be a stacked layer of the layer 566a, the layer 566b, and the layer 566c as illustrated in FIG. 16(E).

Layers 567a and 567c are a pair of electrodes and can be formed using a metal layer similar to the layer 566a. The layer 567b is a piezoelectric substance, and an organic material such as PVDF (polyvinylidene fluoride) or PVDF-TrFE (polyvinylidene fluoride-trifluoroethylene copolymer) can be used in addition to an inorganic material such as $BaTiO_3$, $PbTiO_3$, or $Pb(Zr, Tl) O_3$(PZT). Note that the above piezoelectric substance also functions as a pyroelectric material.

The layer 562 illustrated in FIG. 16(A) can include an OS transistor. Furthermore, the layer 562 can include a support substrate. As the support substrate, in addition to a hard substrate such as a glass substrate or a silicon substrate, a flexible substrate such as metal foil or a resin film may be used. The OS transistor can be formed directly on these support substrates. Alternatively, the OS transistor formed over a hard substrate may be transferred to a flexible substrate.

As a semiconductor material used for the OS transistors, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later or the like can be used.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor that forms the semiconductor layer is an In-M-Zn-based oxide, it is preferable that the atomic ratio of the metal elements of a sputtering target used to deposit the In-M-Zn oxide satisfy In≥M and Zn≥M. The atomic ratio of metal elements of such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the deposited semiconductor layer varies from the above atomic ratios of metal elements of the sputtering targets in a range of ±40%.

An oxide semiconductor with low carrier density is used as the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

However, the composition is not limited to those, and a material having the appropriate composition may be used depending on required semiconductor characteristics and electrical characteristics of the transistor (field-effect mobility, threshold voltage, or the like). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to be appropriate.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (concentration measured by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Thus, the concentration of alkali metal or alkaline earth metal (concentration measured by secondary ion mass spectrometry) in the semiconductor layer is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor including an oxide semiconductor which contains nitrogen is likely to have normally-on characteristics. Hence, the concentration of nitrogen in the semiconductor layer (concentration measured by secondary ion mass spectrometry) is preferably set to lower than or equal to $5\times10^{18}$ atoms/cm$^3$.

The semiconductor layer may have a non-single-crystal structure, for example. Examples of the non-single-crystal structure include a CAAC-OS including a c-axis aligned crystal (C-Axis Aligned Crystalline Oxide Semiconductor or C-Axis Aligned and A-B-plane Anchored Crystalline Oxide Semiconductor), a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide semiconductor film having an amorphous structure has a completely amorphous structure and no crystal part, for example.

Note that the semiconductor layer may be a mixed film including two or more of a region having an amorphous structure, a region having a microcrystalline structure, a region having a polycrystalline structure, a region of the CAAC-OS, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

The CAC-OS is, for example, a composition of a material in which elements included in an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that an oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter InO$_{X1}$ (X1 is a real number greater than 0)) or indium zinc oxide (hereinafter In$_{X2}$Zn$_{Y2}$O$_{Z2}$ (X2, Y2, and Z2 are real numbers greater than 0)) and gallium oxide (hereinafter GaO$_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite oxide semiconductor having a composition in which a region where $GaO_{X3}$ or the like is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (ml is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

Meanwhile, the CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary cannot sometimes be observed between the region where $GaO_{X3}$ or the like is a main component and the region where $In_{X2}Zn_{Y2}O_{Z2}$ or $InO_{X1}$ is a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is not heated intentionally, for example. In the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring-like high-luminance region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ or the like is a main component and regions where $In_{X2}Zn_{Y2}O_{Z2}$ or $InO_{X1}$ is a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other and form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through the regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility (μ) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, a leakage current can be suppressed and a favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and high field-effect mobility (μ) can be achieved.

Moreover, a semiconductor element using the CAC-OS has high reliability. Thus, the CAC-OS is suitable as a constituent material in a variety of semiconductor devices.

The semiconductor device may have a stacked-layer structure of the layer 561, the layer 562, and a layer 563 as illustrated in FIG. 16(B). At this time, the OS transistor included in the layer 562 can be formed over the layer 563.

As the layer 563, a silicon substrate can be used, for example. The silicon substrate can be provided with a Si transistor or the like. For example, an inverter circuit that is a component of a semiconductor device, a circuit that drives a semiconductor device, a circuit that reads a signal, or the like can be provided.

With such a structure, the components, the peripheral circuits, and the like of the semiconductor device can be dispersed in a plurality of layers and can be provided to overlap with each other, whereby the area of the semiconductor device can be reduced. Note that in the structure of FIG. 16(B), the layer 563 may be a support substrate, and the semiconductor device may be provided in the layer 561 and the layer 562.

Figure 17A:
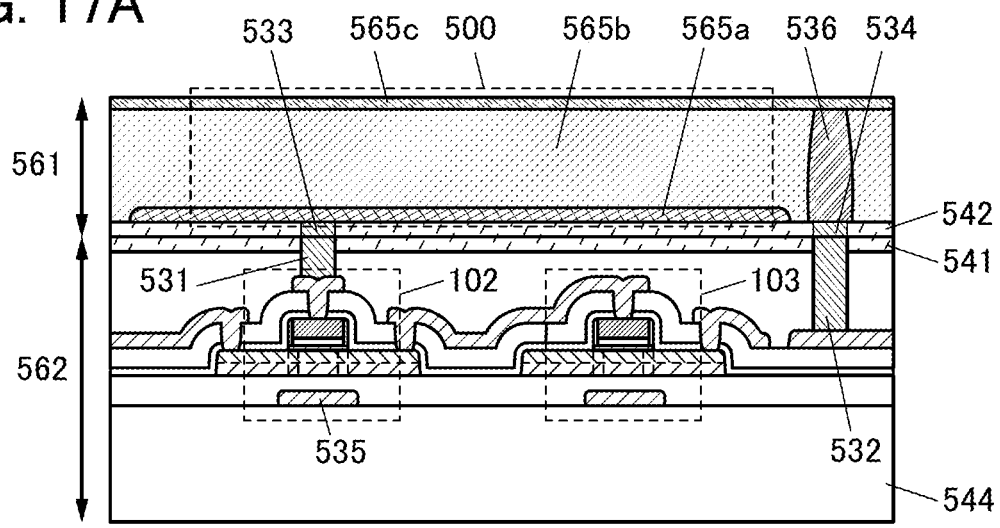
FIGS. 17A and 17B Diagrams showing configurations of a semiconductor device.

FIG. 17(A) is a diagram illustrating an example of a cross section of the semiconductor device illustrated in FIG. 16(A). The layer 561 includes a pn-junction photodiode using silicon for a photoelectric conversion layer, as the sensor element 500. The layer 562 includes an OS transistor formed over a substrate 544, for example.

In the sensor element 500, the layer 565a can be a $p^+$-type region, the layer 565b can be an n-type region, and the layer 565c can be an $n^+$-type region. In the layer 565b, a region 536 for connection between a power supply line and the layer 565c is provided. For example, the region 536 can be a $p^+$-type region.

Figure 19A:
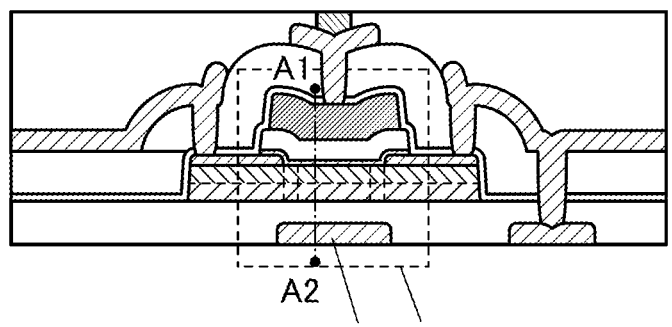
FIGS. 19A-19E Diagrams showing configurations of a semiconductor device.

Although the OS transistor having a self-aligned structure is illustrated in FIG. 17(A), a non-self-aligned top-gate transistor may also be used as illustrated in FIG. 19(A).

Figure 19B:
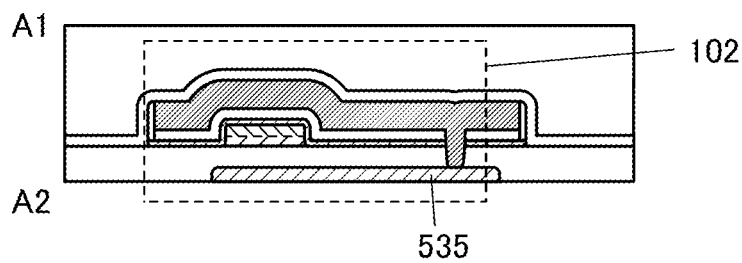

The transistor 102 includes a conductive layer 535 functioning as a second gate. Similarly, the transistor 103 includes the conductive layer 535; however, a structure not including the conductive layer 535 may also be employed. As illustrated in FIG. 19(B), the conductive layer 535 is electrically connected to a front gate of the transistor that is provided to face the conductive layer 535 in some cases. Alternatively, a structure in which a fixed potential different from a potential supplied to the front gate can be supplied to the conductive layer 535 may be employed. A fixed potential is supplied to the conductive layer 535, whereby the threshold voltage of the transistor can be adjusted.

Here, FIG. 17(A) illustrates a structure example in which electrical connection between elements of the layer 561 and elements of the layer 562 is obtained by bonding technique.

An insulating layer 542, a conductive layer 533, and a conductive layer 534 are provided in the layer 561. The conductive layer 533 and the conductive layer 534 each include a region embedded in the insulating layer 542. The conductive layer 533 is electrically connected to the layer 565a. The conductive layer 534 is electrically connected to the region 536. Furthermore, surfaces of the insulating layer 542, the conductive layer 533, and the conductive layer 534 are planarized to be level with each other.

An insulating layer 541, a conductive layer 531, and a conductive layer 532 are provided in the layer 562. The conductive layer 531 and the conductive layer 532 each include a region embedded in the insulating layer 541. The conductive layer 532 is electrically connected to a power supply line. The conductive layer 531 is electrically connected to the first gate of the transistor 102. Furthermore, surfaces of the insulating layer 541, the conductive layer 531, and the conductive layer 532 are planarized to be level with each other.

Here, main components of the conductive layer 531 and the conductive layer 533 are preferably the same metal element. Main components of the conductive layer 532 and the conductive layer 534 are preferably the same metal element. Furthermore, the insulating layer 541 and the insulating layer 542 are preferably formed of the same component.

For example, for the conductive layers 531, 532, 533, and 534, Cu, Al, Sn, Zn, W, Ag, Pt, Au, or the like can be used. Preferably, Cu, Al, W, or Au is used for easy bonding. In addition, for the insulating layers 541 and 542, silicon oxide, silicon oxynitride, silicon nitride oxide, silicon nitride, titanium nitride, or the like can be used.

That is, the same metal element described above is preferably used for a combination of the conductive layer 531 and the conductive layer 533 and the same metal element described above is preferably used for a combination of the conductive layer 532 and the conductive layer 534. Furthermore, the same insulating material described above is preferably used for the insulating layer 541 and the insulating layer 542. With this structure, bonding in which a boundary between the layer 561 and the layer 562 is a bonding position can be performed.

By the bonding, the electrical connection of each of the combination of the conductive layer 531 and the conductive layer 533 and the combination of the conductive layer 532 and the conductive layer 534 can be obtained. In addition, connection between the insulating layer 541 and the insulating layer 542 with mechanical strength can be obtained.

For bonding the metal layers to each other, a surface activated bonding method in which an oxide film, a layer adsorbing impurities, and the like on the surface are removed by sputtering treatment or the like and the cleaned and activated surfaces are brought into contact to be bonded to each other can be used. Alternatively, a diffusion bonding method in which the surfaces are bonded to each other by using temperature and pressure together or the like can be used. Both methods cause bonding at an atomic level, and therefore not only electrically but also mechanically excellent bonding can be achieved.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are brought into contact to be bonded to each other temporarily, and then dehydrated by heat treatment to perform final bonding. The hydrophilic bonding method can also cause bonding at an atomic level; thus, mechanically excellent bonding can be achieved.

When the layer 561 and the layer 562 are bonded together, the insulating layers and the metal layers coexist on their bonding surfaces; therefore, the surface activated bonding method and the hydrophilic bonding method are performed in combination, for example.

For example, the following method can be used: the surfaces are made clean after polishing, the surfaces of the metal layers are subjected to antioxidant treatment and hydrophilicity treatment, and then bonding is performed.

Furthermore, hydrophilicity treatment may be performed on the surfaces of the metal layers being hardly oxidizable metal such as Au. Note that a bonding method other than the above-mentioned methods may be used.

Figure 17B:
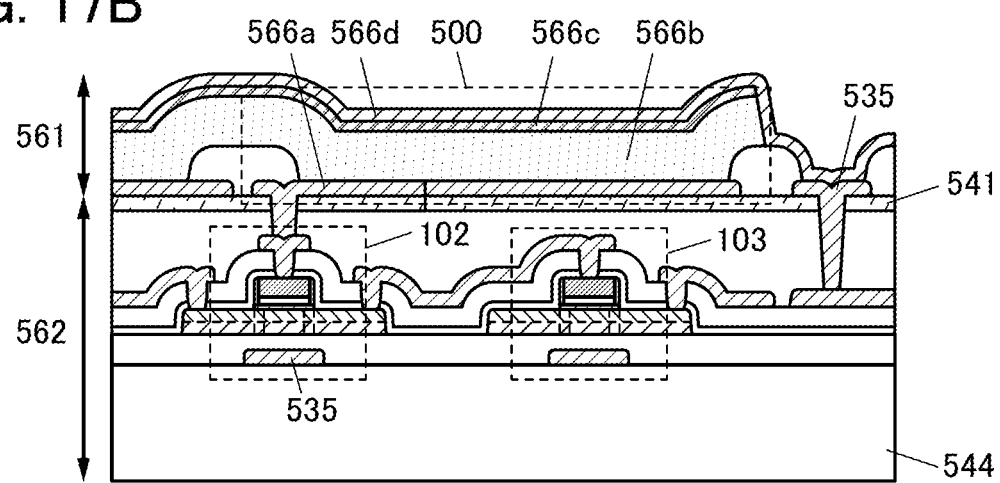

FIG. 17(B) is a cross-sectional view of the case where the pn-junction photodiode illustrated in FIG. 16(D) with a selenium-based material for a photoelectric conversion layer is used for the layer 561 of the semiconductor device illustrated in FIG. 16(A). The layer 566a is included as one electrode, the layers 566b and 566c are included as the photoelectric conversion layer, and the layer 566d is included as the other electrode.

In this case, the layer 561 can be directly formed on the layer 562. The layer 566a is electrically connected to the first gate of the transistor 102. The layer 566d is electrically connected to a power supply line through a conductive layer 537.

Figure 18A:
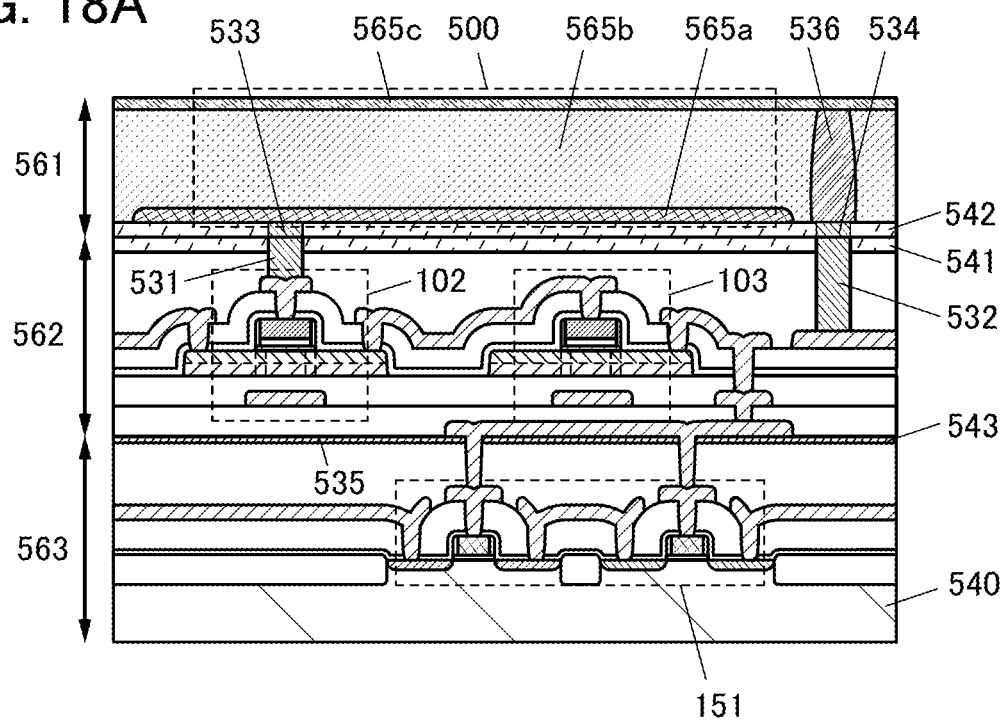
FIGS. 18A and 18B Diagrams showing configurations of a semiconductor device.

FIG. 18(A) is a diagram illustrating an example of a cross section of the semiconductor device illustrated in FIG.

16(B). The layer 561 includes a pn-junction photodiode using silicon for a photoelectric conversion layer, as the sensor element 500. The layer 562 includes an OS transistor and the like. The layer 563 includes a Si transistor and the like. A structure example is illustrated in which electrical connection between the layer 561 and the layer 562 is obtained by bonding.

Figure 19C:
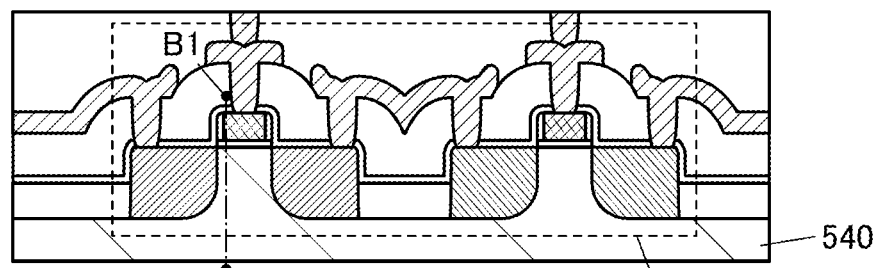
Figure 19D:
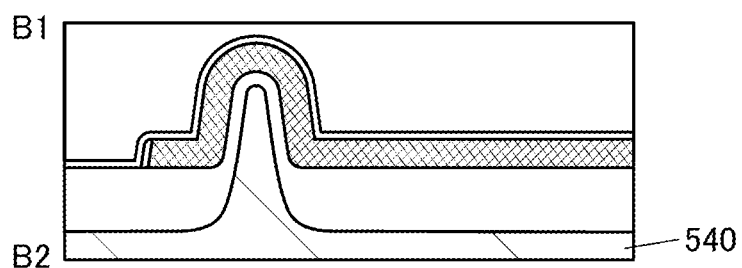

Although the Si transistor illustrated in FIG. 18(A) is of a planar type including a channel formation region in the silicon substrate 540, a structure including a fin semiconductor layer in the silicon substrate 540 as illustrated in FIGS. 19(C) and 19(D) may be employed. FIG. 19(C) corresponds to a cross section in the channel length direction and FIG. 19(D) corresponds to a cross section in the channel width direction.

Figure 19E:
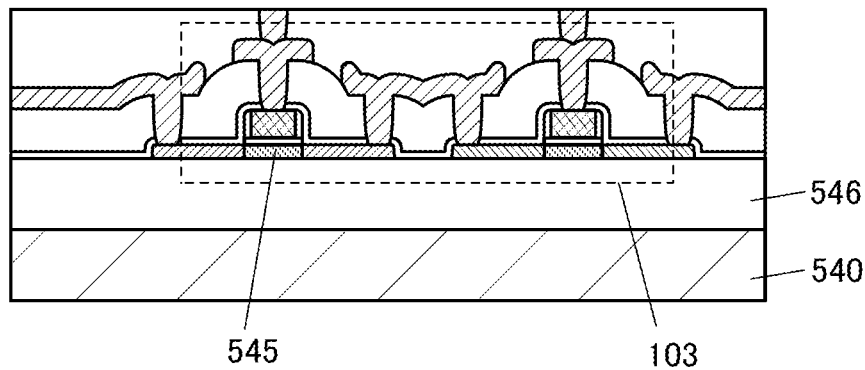

Alternatively, as illustrated in FIG. 19(E), transistors each including a semiconductor layer 545 of a silicon thin film may be used. The semiconductor layer 545 can be single crystal silicon (SOI (Silicon on Insulator)) formed on an insulating layer 546 on the silicon substrate 540, for example.

An insulating layer 543 that has a function of inhibiting diffusion of hydrogen is provided between a region where an OS transistor is formed and a region where a Si transistor is formed. Dangling bonds of silicon are terminated with hydrogen in the insulating layer provided in the vicinity of a channel formation region of the Si transistor. Meanwhile, hydrogen in the insulating layer provided in the vicinity of a channel formation region of the OS transistor is one of the factors in generating carriers in the oxide semiconductor layer.

Hydrogen is confined in one layer by the insulating layer 543, so that the reliability of the Si transistor can be improved. Furthermore, diffusion of hydrogen from the one layer to the other layer is inhibited, so that the reliability of the OS transistor can also be improved.

For the insulating layer 543, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Figure 18B:
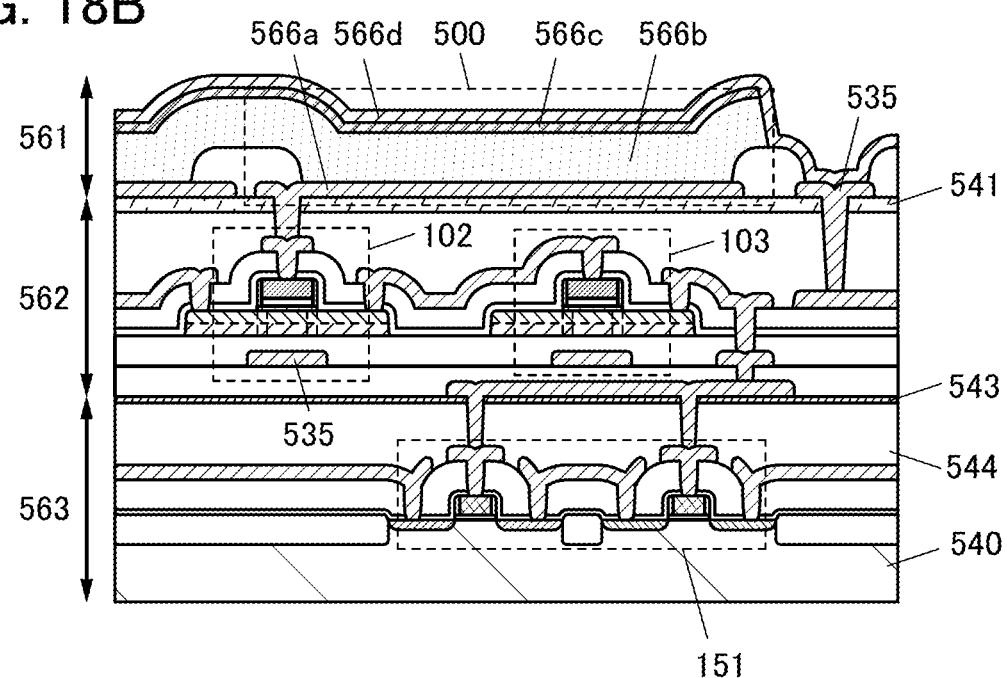

FIG. 18(B) is a cross-sectional view of the case where the pn-junction photodiode illustrated in FIG. 16(D) with a selenium-based material for a photoelectric conversion layer is used for the layer 561 of the semiconductor device illustrated in FIG. 16(B). The layer 561 can be directly formed on the layer 563. The above description can be referred to for the details of the layers 561, 562, and 563.

This embodiment can be combined with any of the other embodiments as appropriate.

Embodiment 4

In this embodiment, electronic components that can be used for the semiconductor device of one embodiment of the present invention will be described.

Figure 20A:
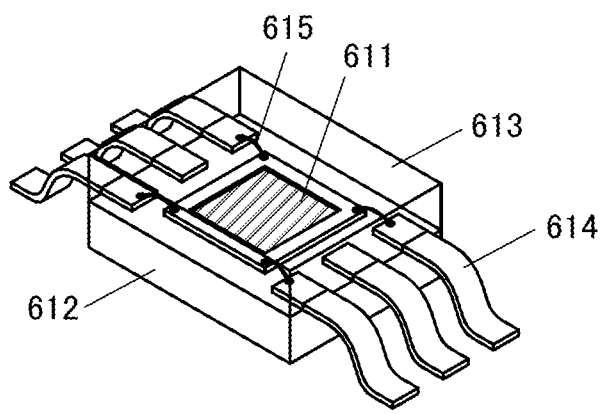
FIGS. 20A-20D Diagrams showing electronic components.

FIG. 20(A) illustrates an example of a surface mount device. A semiconductor device 611 is fixed onto a package substrate 612 and electrically connected to a lead 614 through a wire 615. A package cover 613 is provided thereover, and the semiconductor device 611 is sealed. As a sensor element of the semiconductor device 611, a photoelectric conversion element or a heat sensitive element is preferably used. In this case, a resin that transmits sensed light is used for the package cover 613, for example.

Figure 20B:
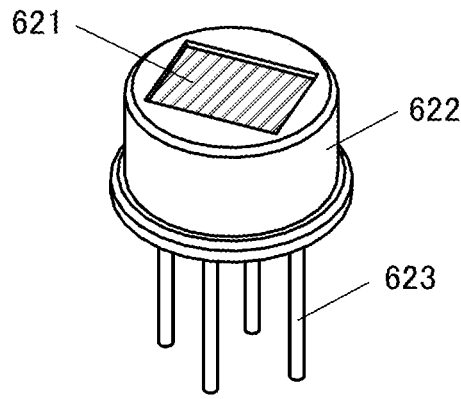

FIG. 20(B) illustrates an example of a leaded component. A semiconductor device 621 is sealed in a metal can 622, and a sensing window is provided thereover. A lens may be combined so that light or heat is condensed to the window. A lead 623 is provided under the metal can 622, which facilitates through-hole mounting. As a sensor element of the semiconductor device 621, a photoelectric conversion element or a heat sensitive element is preferably used.

Figure 20C:
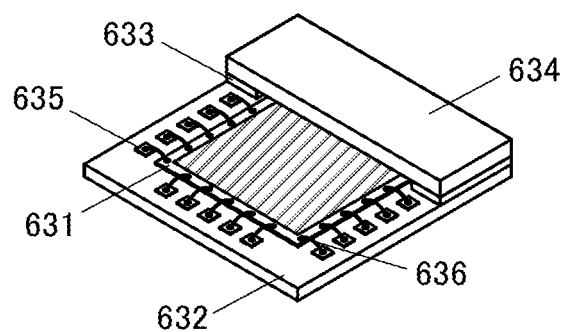

FIG. 20(C) is an example of an image sensor and a perspective view of a package in which a cover glass 634 and an adhesive 633 are partly omitted. Electrode pads 635 are formed over a package substrate 632, and the electrode pads 635 are electrically connected to bumps on a rear surface via through-holes. The electrode pads 635 are electrically connected to semiconductor devices 631 arranged in a matrix through wires 636. As a sensor element of the semiconductor device 631, a photoelectric conversion element or a heat sensitive element is preferably used.

Figure 20D:
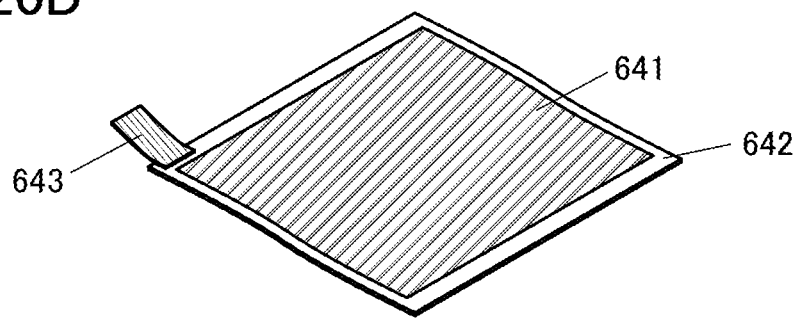

FIG. 20(D) is an example of a sheet sensor. When the semiconductor devices of one embodiment of the present invention are provided over a substrate 642 in a matrix, a large-area sheet sensor can be formed. The substrate 642 preferably has flexibility for convenience. External electrical connection is performed through FPCs (Flexible Printed Circuits) 643. As a sensor element of the semiconductor device 641, a photoelectric conversion element, a piezoelectric element, or a heat sensitive element is preferably used.

Figure 21:
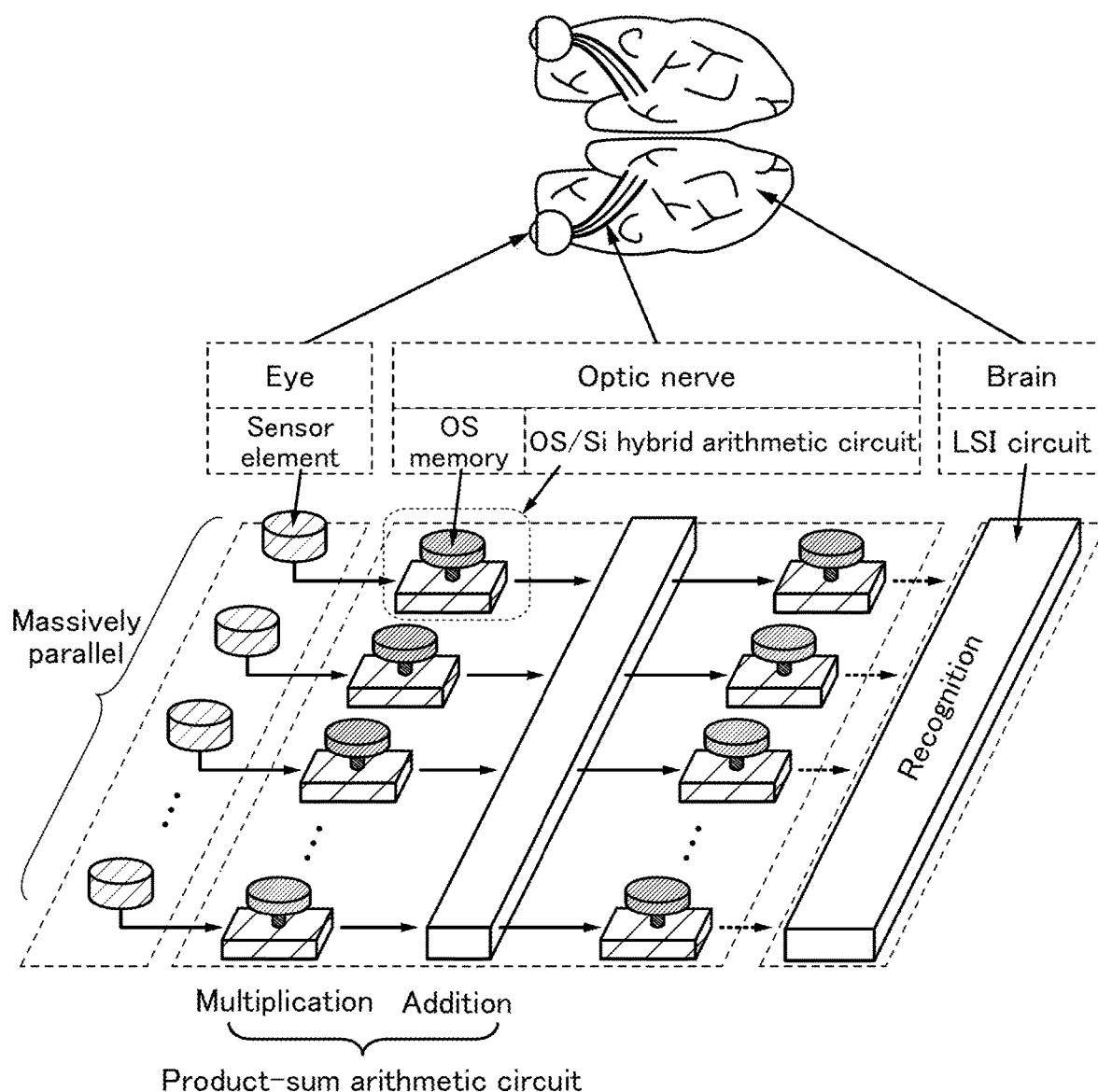
FIG. 21 A diagram showing a combination of a semiconductor device and a neural network.

FIG. 21 is a diagram illustrating a combination of the semiconductor device of one embodiment of the present invention and a neural network (artificial intelligence). Here, the case where the semiconductor device is an image sensor and the analog memory described in the above embodiment is used as a neural network will be described.

In the image sensor, a sensor element (photoelectric conversion element) corresponds to human eyes. Data output from the photoelectric conversion element is input to an OS/Si hybrid arithmetic circuit. The OS/Si hybrid arithmetic circuit includes a pixel circuit formed using an OS transistor and an arithmetic circuit formed using a Si transistor.

The pixel circuit and the arithmetic circuit are components of a product-sum arithmetic circuit and correspond to a human optic nerve. The product-sum arithmetic circuit includes an OS memory (an analog memory composed of an OS transistor and a retaining node) and performs an analog operation (multiplication, addition, or the like) of an input signal.

A weighted signal can be output from the product-sum arithmetic circuit, and the signal is determined or analyzed by an LSI circuit, whereby data output from the photoelectric conversion element can be recognized. That is, the LSI circuit corresponds to the human brain. The LSI circuit can be formed using a Si transistor, for example.

Note that although the flow of data is shown in a horizontal direction in FIG. 21 for easy understanding, in the actual configuration, the components can be stacked in a vertical direction. Accordingly, the pixel circuit, the arithmetic circuit, the OS memory, and the LSI circuit can have regions overlapping with each other, so that the chip area can be made small. Furthermore, wirings for connecting the components to each other can be replaced with plugs or the like, and thus the wiring resistance and the parasitic capacitance become small, leading to higher operation speed.

Moreover, the above configuration is capable of massively-parallel processing compatible with the pixel count and can be used for difficult parallel computation that is a problem in hardware implementation of machine learning. In addition, an analog operation is used; therefore, the frequency of data communication between the arithmetic circuit and the memory can be reduced, so that energy loss can be reduced.

The above configuration can be used for an application such as a wider dynamic range of an image, image correction in which up-conversion or the like is performed, object recognition in autonomous driving of a vehicle, or prevention of a reduction in visibility due to light of an oncoming car (removal of sudden noise).

This embodiment can be combined with the description of the other embodiments as appropriate.

REFERENCE NUMERALS

100a: semiconductor device, 100b: semiconductor device, 100c: semiconductor device, 100d: semiconductor device, 100e: semiconductor device, 101: sensor element, 102: transistor, 103: transistor, 104: transistor, 105: capacitor, 106: transistor, 107: transistor, 108: transistor, 111: wiring, 112: wiring, 113: wiring, 114: wiring, 115: wiring, 116: wiring, 117: wiring, 118: wiring, 119: wiring, 120: wiring, 121: wiring, 131: sensor element, 132: transistor, 133: transistor, 134: transistor, 135: capacitor, 143: wiring, 150: circuit block, 151: inverter circuit, 152: delay circuit, 160: circuit, 170: circuit, 171: circuit, 172: circuit, 173: circuit, 180: sensor array, 200: oscillator, 202: counter circuit, 500: sensor element, 531: conductive layer, 532: conductive layer, 533: conductive layer, 534: conductive layer, 535: conductive layer, 536: region, 537: conductive layer, 540: silicon substrate, 541: insulating layer, 542: insulating layer, 543: insulating layer, 544: substrate, 545: semiconductor layer, 546: insulating layer, 561: layer, 562: layer, 563: layer, 565a: layer, 565b: layer, 565c: layer, 566a: layer, 566b: layer, 566c: layer, 566d: layer, 567a: layer, 567b: layer, 567c: layer, 611: semiconductor device, 612: package substrate, 613: package cover, 614: lead, 615: wire, 621: semiconductor device, 622: metal can, 623: lead, 631: semiconductor device, 632: package substrate, 633: adhesive, 634: cover glass, 635: electrode pad, 636: wire, 641: semiconductor device, 642: substrate, 643: FPC.

The invention claimed is:

1. A semiconductor device comprising a sensor element, a first transistor, a second transistor, and a third transistor,
   wherein the sensor element comprises a pair of electrodes,
   wherein the first transistor comprises a first gate and a second gate facing the first gate with a semiconductor layer therebetween,
   wherein one electrode of the sensor element is electrically connected to the first gate,
   wherein the first gate is electrically connected to one of a source and a drain of the third transistor,
   wherein one of a source and a drain of the first transistor is electrically connected to a gate of the second transistor, and
   wherein the semiconductor layer comprises a metal oxide.

2. The semiconductor device according to claim 1, wherein the sensor element is a photoelectric conversion element, a piezoelectric element, or a heat sensitive element.

3. The semiconductor device according to claim 1, further comprising a capacitor,
   wherein one electrode of the capacitor is electrically connected to the gate of the second transistor.

4. The semiconductor device according to claim 1, further comprising a fourth transistor,
   wherein one of a source and a drain of the fourth transistor is electrically connected to one of a source and a drain of the second transistor.

5. The semiconductor device according to claim 4, further comprising a shift register circuit and an A/D converter circuit,
   wherein a gate of the fourth transistor is electrically connected to the shift register circuit, and
   wherein the other of the source and the drain of the fourth transistor is electrically connected to the A/D converter circuit.

6. The semiconductor device according to claim 1, further comprising an inverter circuit and a counter circuit,
   wherein an output terminal of the inverter circuit is electrically connected to the other of a source and a drain of the second transistor,
   wherein an input terminal of the inverter circuit is electrically connected to one of the source and the drain of the second transistor, and
   wherein an input terminal of the counter circuit is electrically connected to the input terminal of the inverter circuit.

7. The semiconductor device according to claim 1, wherein the metal oxide comprises In, Zn, and M, M being Al, Ti, Ga, Sn, Y, Zr, La, Ce, Nd, or Hf.

8. An electronic component comprising:
   the semiconductor device according to claim 1, and a lead.

9. A semiconductor device comprising a photodiode, a first transistor, and a second transistor,
   wherein the first transistor comprises a first gate and a second gate facing the first gate with a semiconductor layer therebetween,
   wherein one electrode of the photodiode is electrically connected to the first gate,
   wherein one of a source and a drain of the first transistor is electrically connected to a gate of the second transistor,
   wherein the other of the source and the drain of the first transistor is electrically connected to the other electrode of the photodiode, and
   wherein the semiconductor layer comprises a metal oxide.

10. The semiconductor device according to claim 9, further comprising a capacitor,
    wherein one electrode of the capacitor is electrically connected to the gate of the second transistor.

11. The semiconductor device according to claim 9, further comprising a fourth transistor,
    wherein one of a source and a drain of the fourth transistor is electrically connected to one of a source and a drain of the second transistor.

12. The semiconductor device according to claim 11, further comprising a shift register circuit and an A/D converter circuit,
    wherein a gate of the fourth transistor is electrically connected to the shift register circuit, and
    wherein the other of the source and the drain of the fourth transistor is electrically connected to the A/D converter circuit.

13. The semiconductor device according to claim 9, further comprising an inverter circuit and a counter circuit,
    wherein an output terminal of the inverter circuit is electrically connected to the other of a source and a drain of the second transistor,
    wherein an input terminal of the inverter circuit is electrically connected to one of the source and the drain of the second transistor, and
    wherein an input terminal of the counter circuit is electrically connected to the input terminal of the inverter circuit.

14. The semiconductor device according to claim 9,
wherein the metal oxide comprises In, Zn, and M, M being Al, Ti, Ga, Sn, Y, Zr, La, Ce, Nd, or Hf.

15. An electronic component comprising:
the semiconductor device according to claim 9, and a lead.

16. A semiconductor device in which an odd number of circuit blocks are connected in series, and an input terminal in a first stage and an output terminal in a last stage are electrically connected to each other,
wherein the circuit block comprises an inverter circuit and a delay circuit,
wherein the delay circuit comprises a sensor element, a first transistor, a second transistor, and a third transistor,
wherein the sensor element comprises a pair of electrodes,
wherein the first transistor comprises a first gate and a second gate facing the first gate with a semiconductor layer therebetween,
wherein one electrode of the sensor element is electrically connected to the first gate,
wherein the first gate is electrically connected to one of a source and a drain of the third transistor,
wherein the second gate is electrically connected to one of a source and a drain of the second transistor,
wherein one of a source and a drain of the first transistor is electrically connected to an output terminal of the inverter circuit,
wherein the semiconductor layer comprises a metal oxide,
wherein an input terminal of the inverter circuit is an input terminal of the circuit block, and
wherein the other of the source and the drain of the first transistor is an output terminal of the circuit block.

17. The semiconductor device according to claim 16,
wherein the sensor element is a photoelectric conversion element, a piezoelectric element, or a heat sensitive element.

18. The semiconductor device according to claim 16,
wherein the sensor element is shared by all the circuit blocks.

19. The semiconductor device according to claim 16,
wherein the third transistor is shared by all the circuit blocks.

20. The semiconductor device according to claim 16,
wherein the metal oxide comprises In, Zn, and M, M being Al, Ti, Ga, Sn, Y, Zr, La, Ce, Nd, or Hf.

21. An electronic component comprising:
the semiconductor device according to claim 16, and a lead.

* * * * *